(12) United States Patent
Hiramatsu

(10) Patent No.: US 8,706,050 B2
(45) Date of Patent: Apr. 22, 2014

(54) MATCHING CIRCUIT, WIRING BOARD, AND TRANSMITTER, RECEIVER, TRANSCEIVER, AND RADAR APPARATUS THAT HAVE THE MATCHING CIRCUIT

(75) Inventor: Nobuki Hiramatsu, Soraku-gun (JP)

(73) Assignee: Kyocera Corporation, Kyoto (JP)

( * ) Notice: Subject to any disclaimer, the term of this patent is extended or adjusted under 35 U.S.C. 154(b) by 397 days.

(21) Appl. No.: 13/056,942

(22) PCT Filed: Jul. 31, 2009

(86) PCT No.: PCT/JP2009/063697
§ 371 (c)(1),
(2), (4) Date: Mar. 2, 2011

(87) PCT Pub. No.: WO2010/013819
PCT Pub. Date: Feb. 4, 2010

(65) Prior Publication Data
US 2011/0143687 A1    Jun. 16, 2011

(30) Foreign Application Priority Data

Jul. 31, 2008 (JP) .................................. 2008-199057

(51) Int. Cl.
*H04B 1/38* (2006.01)

(52) U.S. Cl.
USPC ................. 455/73; 333/33; 333/34; 333/254; 340/572.7

(58) Field of Classification Search
CPC ............ H03H 7/38; H03H 3/00; H01P 3/085; H01P 5/028
USPC ................. 455/73; 333/33, 34, 238, 246, 247
See application file for complete search history.

(56) References Cited

U.S. PATENT DOCUMENTS

| | | | |
|---|---|---|---|
| 6,177,872 B1 * | 1/2001 | Kodukula et al. | 340/572.7 |
| 7,498,897 B2 * | 3/2009 | Yoshida et al. | 333/33 |
| 2003/0206077 A1 | 11/2003 | du Toit et al. | |
| 2006/0170515 A1 * | 8/2006 | Yoshida et al. | 333/33 |
| 2008/0211604 A1 | 9/2008 | Katayama et al. | |
| 2009/0284333 A1 | 11/2009 | Dolmans | 333/254 |

FOREIGN PATENT DOCUMENTS

| | | |
|---|---|---|
| DE | 102007046351 A1 | 4/2008 |
| EP | 0532845 A1 | 3/1993 |
| JP | 5531373 U | 2/1980 |
| JP | 04322502 A | 11/1992 |

(Continued)

OTHER PUBLICATIONS

German language office action dated Feb. 22, 2013 and its English language translation issued in corresponding German application 112009001919.6.

*Primary Examiner* — David Bilodeau
(74) *Attorney, Agent, or Firm* — DLA Piper LLP (US)

(57) ABSTRACT

There are provided a matching circuit which is less prone to impedance mismatch even with variations in pattern dimension, and a wiring board, and also a transmitter, a receiver, a transceiver, and a radar apparatus that succeed in offering stable characteristics with the installation of the matching circuit. Characteristic impedance of a first transmission line including a connection portion is varied between a reflection source including a stub portion and a bonding wire serving as a load. Impedance variation is achieved by varying a distance from the connection portion to a back conductor layer coupled thereto with respect to a distance from the stub portion and a transmission line portion to an inner conductor layer coupled to them.

8 Claims, 14 Drawing Sheets

(56) References Cited

FOREIGN PATENT DOCUMENTS

| JP | 08-097611 | 4/1996 |
| JP | 10-256801 | 9/1998 |
| JP | 2001-102820 | 4/2001 |
| JP | 2003-069313 | 3/2003 |
| JP | 2008-160785 | 7/2008 |
| WO | WO 2008/007303 A1 | 1/2008 |

* cited by examiner

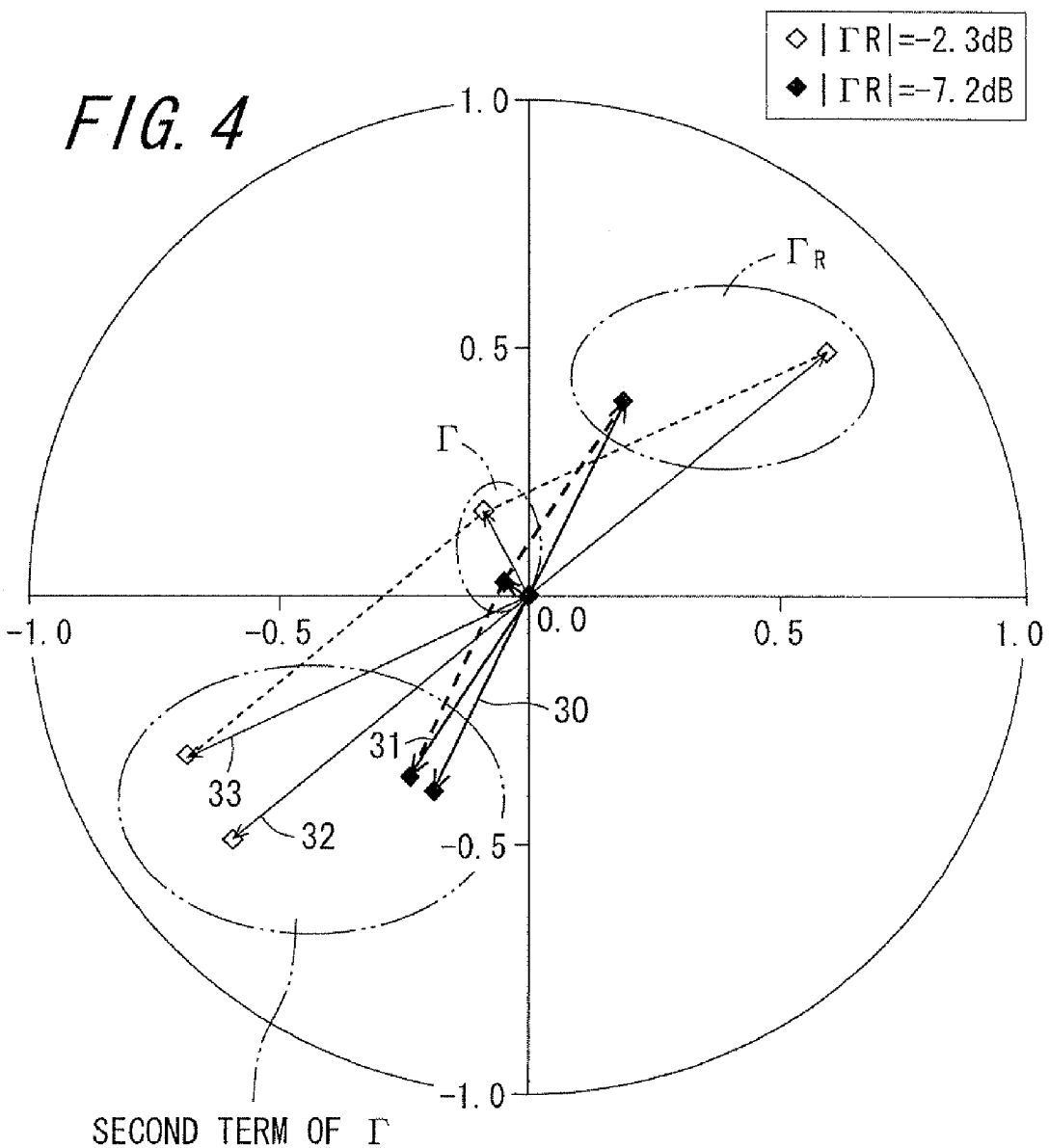

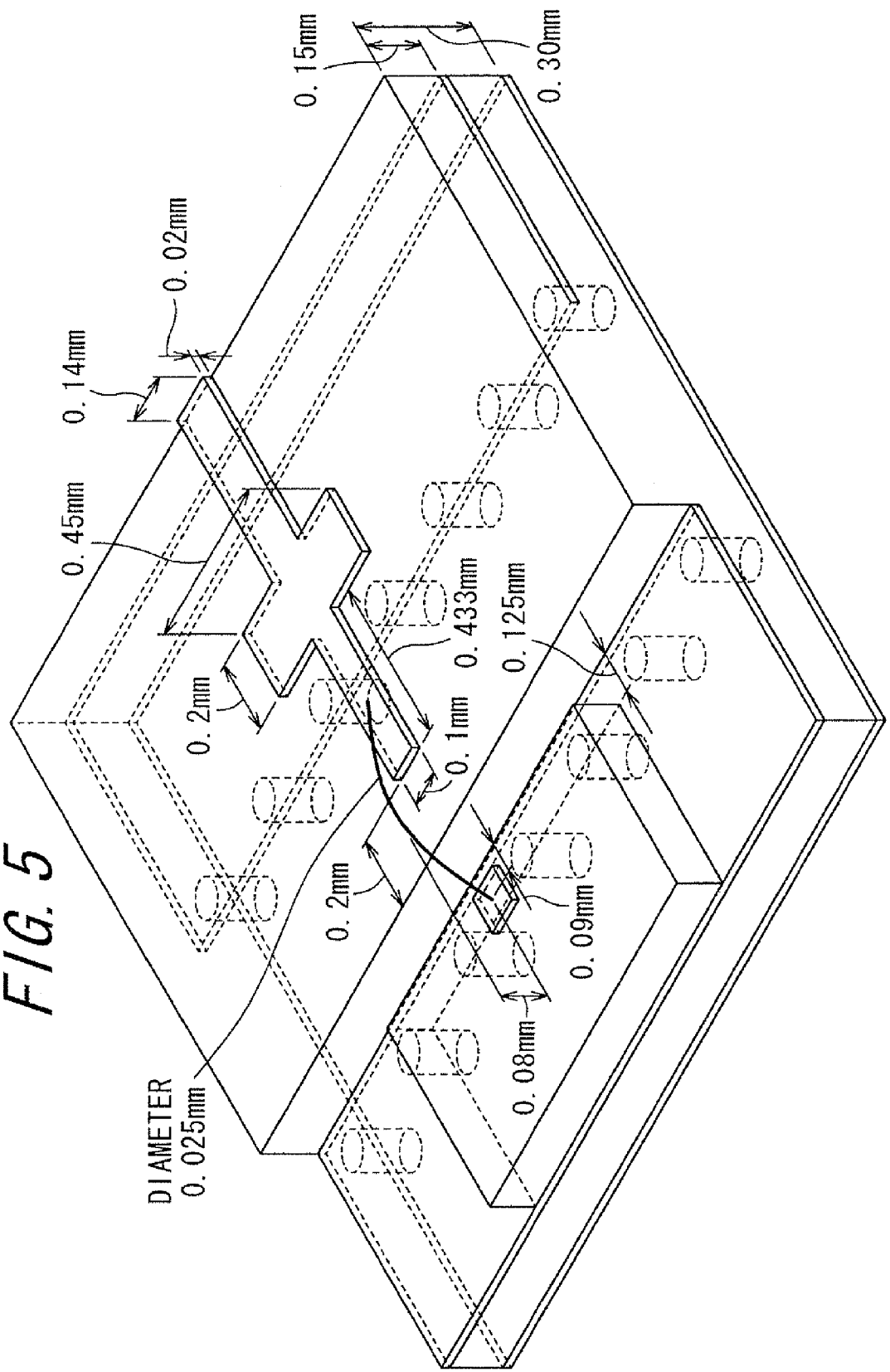

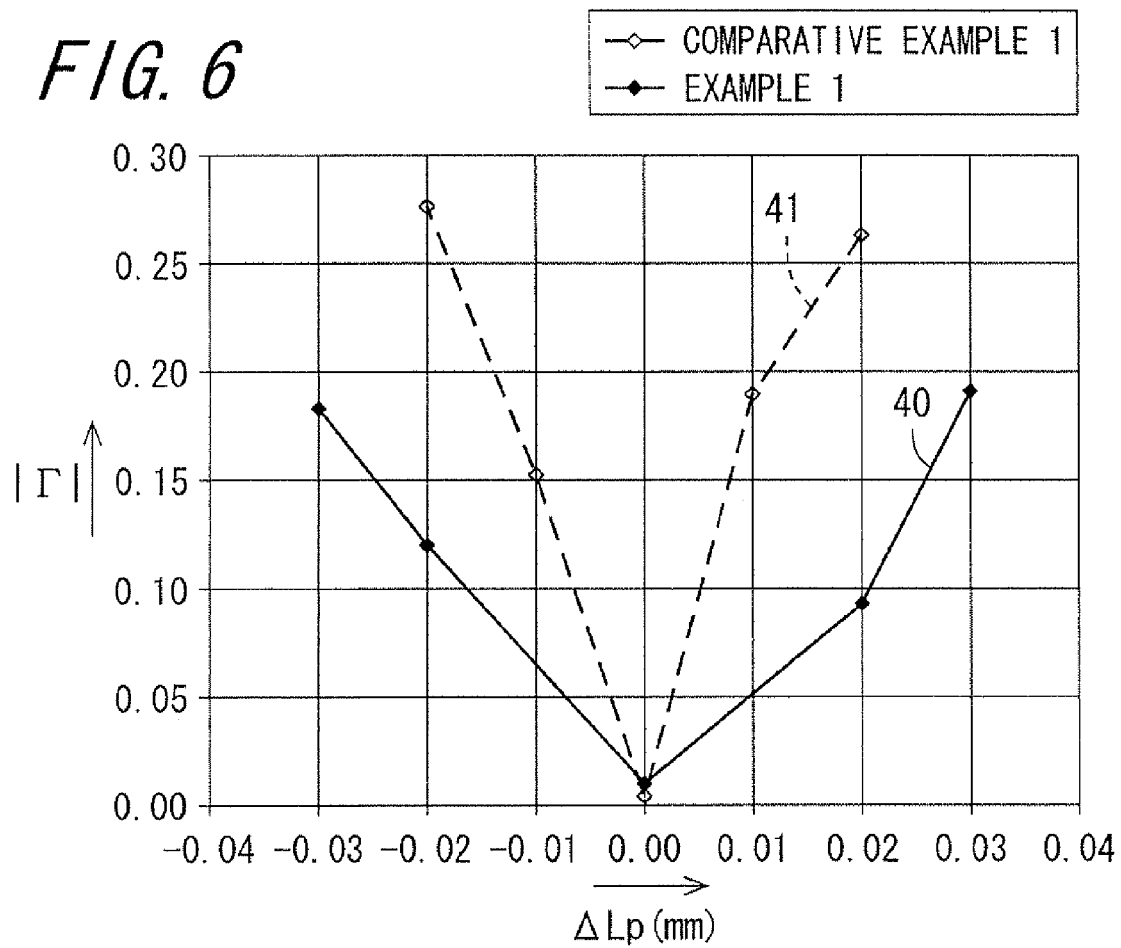

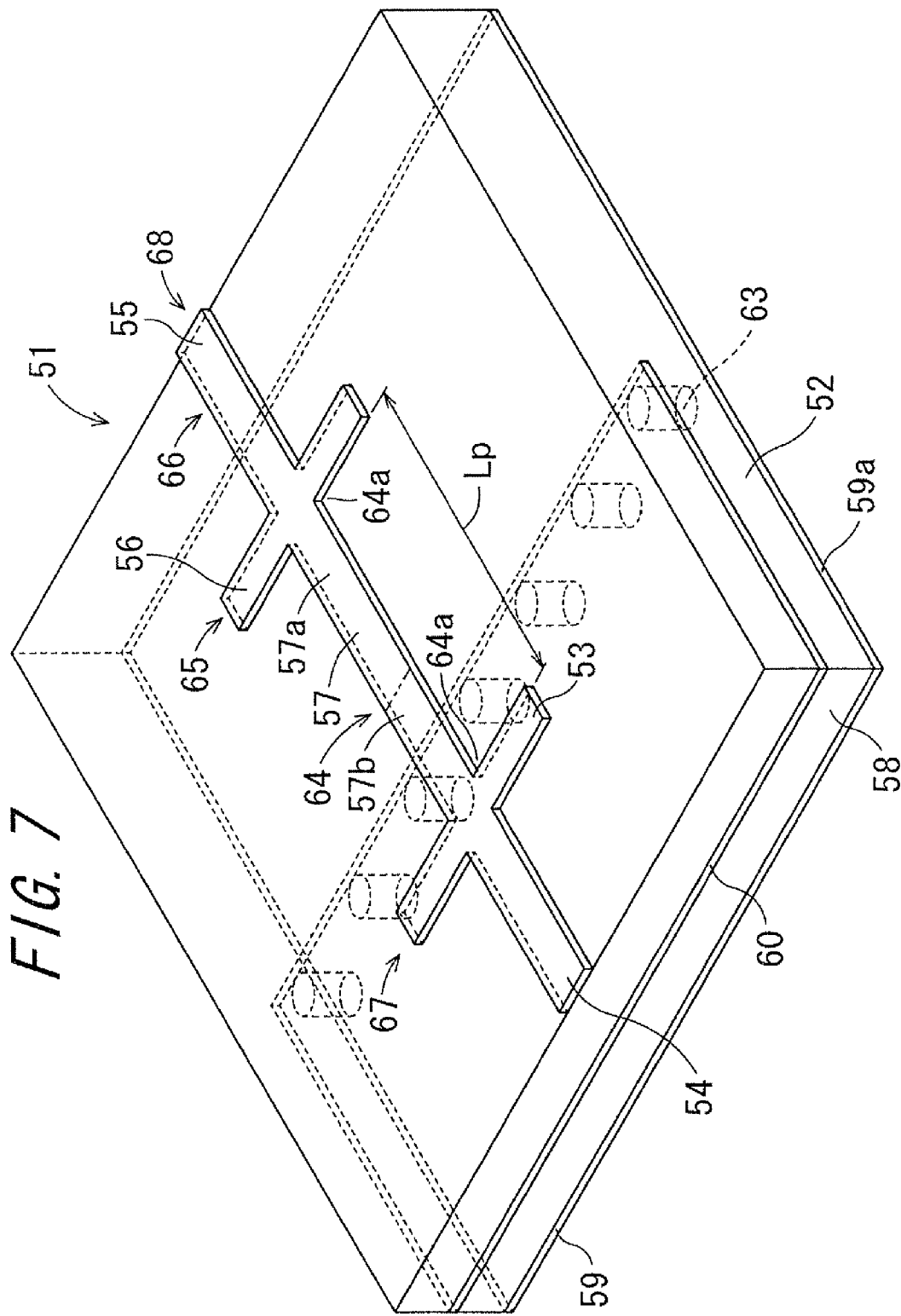

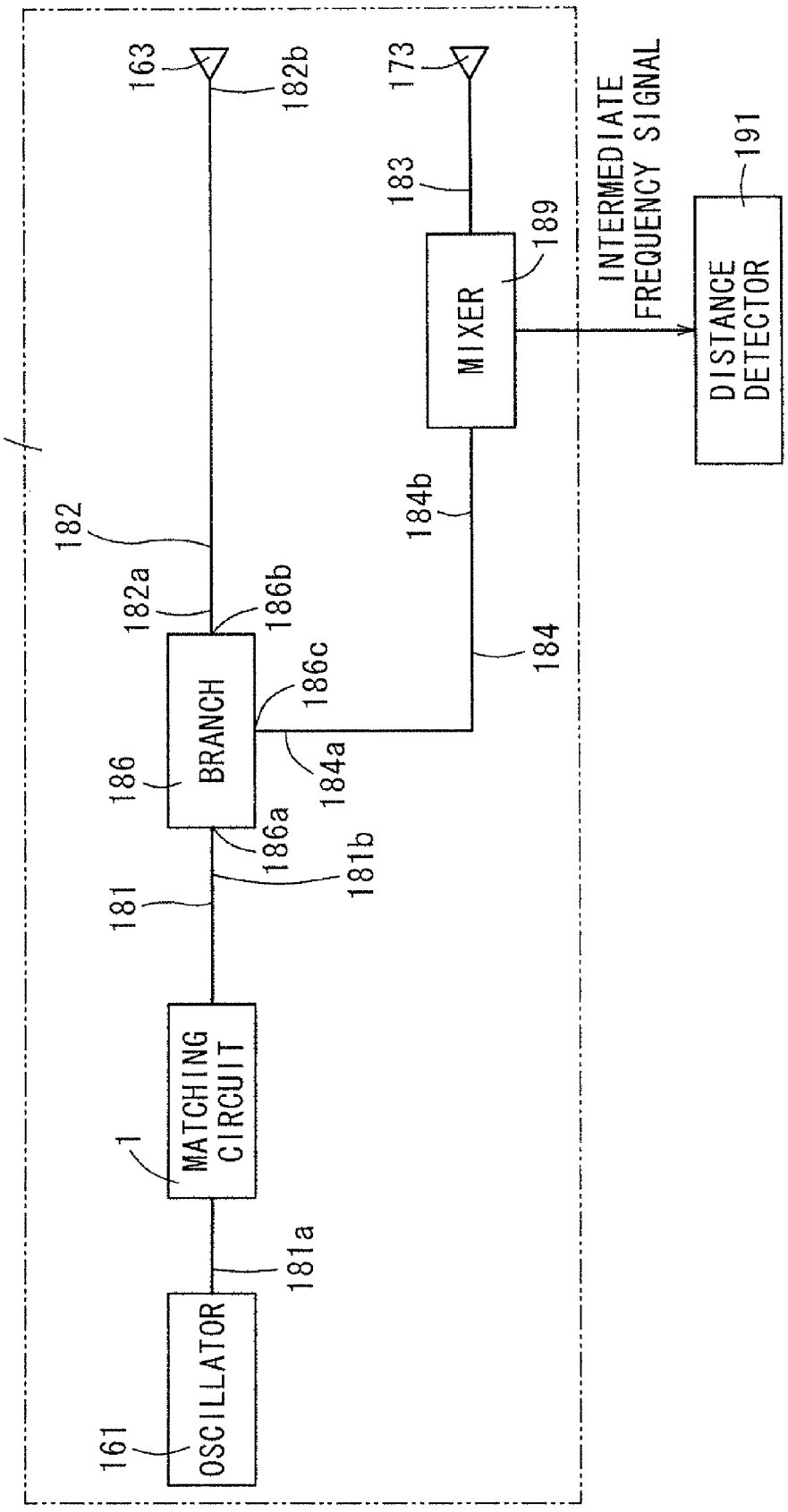

MATCHING CIRCUIT, WIRING BOARD, AND TRANSMITTER, RECEIVER, TRANSCEIVER, AND RADAR APPARATUS THAT HAVE THE MATCHING CIRCUIT

TECHNICAL FIELD

The present invention relates to a matching circuit configured to compensate for impedance mismatch used in a high-frequency circuit adapted to a high-frequency band such as millimeter waves and microwaves, and a wiring board, as well as to a transmitter, a receiver, a transceiver, and a radar apparatus that each have the matching circuit.

BACKGROUND ART

In the recent advanced information-based society, in order to achieve high-speed transmission of large-volume data, application systems, such as an information-communication apparatus, that utilize electromagnetic waves in high-frequency bands ranging from a microwave region of 1 to 30 GHz to a millimeter-wave region of 30 to 300 GHz have been proposed to date. For example, there is proposed a system utilizing millimeter waves such as a radar apparatus for measuring inter-vehicle distances.

Such a system utilizing electromagnetic waves of high frequencies employs a high-frequency circuit. As a problem encountered in the field of high-frequency circuit technology, the frequency of a signal for use is so high that impedance mismatch occurs in the parts of connection between high-frequency components, thus causing significant high-frequency signal reflection. For example, in a bonding wire used to provide electrical connection among a semiconductor device, a package, and a wiring board, the higher the frequency of a high-frequency signal to be transmitted becomes, the larger the reactance resulting from inductance components becomes. Therefore, in the case of connecting a high-frequency component such as an MMIC (Microwave Monolithic Integrated Circuit) with a 50Ω transmission line by the bonding wire, impedance mismatch occurs in a connection portion, thus causing significant high-frequency signal reflection.

As a technique to achieve a reduction in reflection in such a connection portion, for example, in a semiconductor package described in Patent literature 1, a stub is disposed in an air space between an end of the semiconductor package and an end of a circuit board to achieve impedance matching.

Moreover, in a high-frequency circuit described in Patent literature 2, a coplanar line having a narrow portion and a broad portion is formed, and a filter is formed by connecting a bonding wire to this coplanar line. In this construction, the line parameters of the narrow portion and the broad portion are determined, using a transfer matrix, so that impedance matching can be achieved in respect of the connected lines at the input end and the output end of the filter.

However, even if an impedance matching circuit is provided by determining pattern configurations and dimensions of transmission lines in a way as shown in Patent literatures 1 and 2, in a step of forming the transmission lines including the matching circuit, variations in dimension of line patterns constituting the matching circuit occur, with consequent deviations of the dimensions of the manufactured circuit from designed values. This gives rise to impedance mismatch.

CITATION LIST

Patent Literature

Patent literature 1: Japanese Unexamined Patent Publication JP-A 2003-69313

Patent literature 2: Japanese Unexamined Patent Publication JP-A 2001-102820

SUMMARY OF INVENTION

An object of the invention is to provide a matching circuit which is less prone to impedance mismatch even with variations in pattern dimension, and a wiring board, and also a transmitter, a receiver, a transceiver, and a radar apparatus that succeed in offering stable characteristics with the installation of the matching circuit.

A matching circuit according to a first aspect of the invention comprises a first transmission line, a reflection source, and a second transmission line. The first transmission line has a first end being connected with a load for use and a second end, and a variance area. Particularly, the first transmission line possesses a variance area exhibiting characteristic impedance variation located between the first end and the second end. The reflection source is configured to transmit signals on the load connected to the first end. The reflection source is connected to the second end and differs in form from the first transmission line. The second transmission line is connected to the reflection source.

Moreover, a wiring board according to a second aspect of the invention comprises the matching circuit mentioned above. The wiring board comprises a dielectric layer, a signal line, an inner conductor layer, and a back conductor layer. The signal line is disposed on a surface of the dielectric layer. The inner conductor layer and the back conductor layer function as a ground conductor layer which is coupled to the signal line. The inner conductor layer is formed inside the dielectric layer. The back conductor layer is formed on an opposite surface of the dielectric layer from that formed with the signal line. The variance area is formed with the distance varied between the signal line and the ground conductor layer, by setting a distance between the signal line and the inner conductor layer and a distance between the signal line and the back conductor layer to differ from each other, to vary a distance.

Moreover, a transmitter according to a third aspect of the invention comprises a high-frequency oscillator, transmitting-signal transmission line, the matching circuit mentioned above, and an antenna. The high-frequency oscillator produces high-frequency signals. The transmitting-signal transmission line is connected to the high-frequency oscillator, and configured to transmit the high-frequency signals from the high-frequency oscillator. The matching circuit is inserted into the transmitting-signal transmission line so that the high-frequency signals from the high-frequency oscillator pass therethrough. The antenna is connected to the transmitting-signal transmission line, and configured to radiate the high-frequency signals.

Moreover, a receiver according to a fourth aspect of the invention comprises an antenna, a received-signal transmission line, the matching circuit mentioned above, and a high-frequency wave detector. The antenna catches high-frequency signals. The received-signal transmission line is connected to the antenna, and configured to transmit the high-frequency signals caught by the antenna. The matching circuit is inserted into the received-signal transmission line so that the high-frequency signals from the antenna pass therethrough. The high-frequency wave detector is connected to the received-signal transmission line, and configured to detect the high-frequency signals transmitted to the received-signal transmission line.

Moreover, a transceiver according to a fifth aspect of the invention comprises a high-frequency oscillator, a third transmission line, a branch, a fourth transmission line, a divider, a fifth transmission line, an antenna, a sixth transmission line, a seventh transmission line, mixer, and the matching circuit mentioned above. The high-frequency oscillator produces high-frequency signals. The third transmission line is connected to the high-frequency oscillator, and configured to transmit the high-frequency signals. The branch comprises a first terminal, a second terminal, and a third terminal, the first terminal being connected to the third transmission line, and is configured to selectively output the high-frequency signals fed to the first terminal to the second terminal or the third terminal. The fourth transmission line is connected to the second terminal, and configured to transmit a high-frequency signal fed from the second terminal. The divider comprises a fourth terminal, a fifth terminal, and a sixth terminal, and is configured to output a high-frequency signal fed to the fourth terminal through the fourth transmission line to the fifth terminal, and output a high-frequency signal fed to the fifth terminal to the sixth terminal.

The fifth transmission line is connected to the fifth terminal, and configured to transmit a high-frequency signal outputted from the fifth terminal and transmit a high-frequency signal to the fifth terminal. The antenna is connected to the fifth transmission line, and configured to radiate and catch high-frequency signals. The sixth transmission line is connected to the third terminal, and configured to transmit a high-frequency signal outputted from the third terminal. The seventh transmission line is connected to the sixth terminal, and configured to transmit a high-frequency signal outputted from the sixth terminal. The mixer is connected to the sixth transmission line and the seventh transmission line, and configured to mix the high-frequency signals fed from the sixth and seventh transmission lines to output an intermediate-frequency signal. The matching circuit is inserted into at least one of the third to seventh transmission lines so that one of a high-frequency signal from the high-frequency oscillator, a high-frequency signal from the branch, a high-frequency signal caught by the antenna, and a high-frequency signal from the divider passes therethrough.

Moreover, a transceiver according to a sixth aspect of the invention comprises a high-frequency oscillator, a third transmission line, a branch, a fourth transmission line, a transmitting antenna, a receiving antenna, a fifth transmission line, a sixth transmission line, a mixer, and the matching circuit mentioned above. The high-frequency oscillator produces high-frequency signals. The third transmission line is connected to the high-frequency oscillator, and configured to transmit high-frequency signals. The branch comprises a first terminal, a second terminal, and a third terminal, the first terminal being connected to the third transmission line, and configured to selectively output high-frequency signals fed to the first terminal to the second terminal or the third terminal. The fourth transmission line is connected to the second terminal, and configured to transmit a high-frequency signal fed from the second terminal. The transmitting antenna is connected to the fourth transmission line, and configured to radiate high-frequency signals. The receiving antenna catches high-frequency signals. The fifth transmission line is connected to the receiving antenna, and configured to transmit the caught high-frequency signals. The sixth transmission line is connected to the third terminal, and configured to transmit a high-frequency signal outputted from the third terminal. The mixer is connected to the fifth transmission line and the sixth transmission line, and configured to mix the high-frequency signals fed from the fifth and sixth transmission lines to output an intermediate-frequency signal. The matching circuit is inserted into at least one of the third to sixth transmission lines so that one of a high-frequency signal from the high-frequency oscillator, a high-frequency signal from the branch, and a high-frequency signal caught by the receiving antenna passes therethrough.

Further, a radar device according to a seventh aspect of the invention comprises the transceiver mentioned above and a distance detector. The distance detector is configured to detect a distance from the transceiver to an object to be detected on a basis of the intermediate-frequency signal from the transceiver.

According to the matching circuit in accordance with the first aspect of the invention, the first transmission line includes a variance area exhibiting characteristic impedance variation located between the first end connected with a load for use and the second end.

According to the wiring board in accordance with the second aspect of the invention, in a case where the first transmission line and the reflection source are constructed of the signal line and the ground conductor layer connected to the signal line, characteristic impedance variation in the first transmission line is attained by making a change to the distance between the signal line and the ground conductor layer.

In this way, the reflection coefficient of the first transmission line can be lowered. Thus, even if transmission signals are phase-shifted due to occurrence of variations in pattern dimension, with the lowered reflection coefficient, a matching circuit insensitive to the variations in pattern dimensions can be attained.

According to the transmitter in accordance with the third aspect of the invention, a high-frequency signal from the high-frequency oscillator is transmitted through the transmitting-signal transmission line and is then radiated from the antenna. In the transmitter of this aspect, the matching circuit is inserted into the transmitting-signal transmission line so that a high-frequency signal from the high-frequency oscillator passes therethrough. Therefore, impedance mismatch is not likely to occur even with variations in pattern dimension for example, and reflection can thus be suppressed. This makes it possible to attain a transmitter which has stable oscillation characteristics, and provides high transmission output by virtue of insertion loss being kept lower.

According to the receiver in accordance with the fourth aspect of the invention, a high-frequency signal caught by the antenna is transmitted through the received-signal transmission line and is then wave-detected by the high-frequency wave detector. In the receiver of this aspect, the matching circuit is inserted into the received-signal transmission line so that a high-frequency signal caught by the antenna passes therethrough. Therefore, impedance mismatch is not likely to occur even with variations in pattern dimension for example, and reflection can thus be suppressed. This makes it possible to attain a receiver which has stable wave detection characteristics, and provides high wave detection output by virtue of insertion loss being kept lower.

According to the transceiver in accordance with the fifth aspect of the invention, a high-frequency signal produced by the high-frequency oscillator is transmitted through the third transmission line to be fed to the first terminal of the branch, is fed from the second terminal of the branch to the fourth transmission line, is fed to the fourth terminal of the divider, is fed from the fifth terminal of the divider to the fifth transmission line, and is eventually radiated from the antenna. Moreover, a high-frequency signal received by the antenna is fed to the fifth transmission line, is fed to the fifth terminal of the divider, is fed from the sixth terminal of the divider to the seventh transmission line, and is then fed to the mixer. Further, the mixer receives a high-frequency signal produced by the high-frequency oscillator that has been transmitted through the third terminal of the branch and the sixth transmission line in the form of a local signal. The mixer mixes a high-frequency signal produced by the high-frequency oscillator and a high-frequency signal received by the antenna to output an intermediate-frequency signal. In this way, information included in the received high-frequency signal can be obtained.

The matching circuit is inserted into at least one of the third to seventh transmission lines so that one of a high-frequency signal from the high-frequency oscillator, a high-frequency signal from the branch, a high-frequency signal caught by the antenna, and a high-frequency signal from the divider pass therethrough. By doing so, impedance mismatch is not likely to occur even with variations in pattern dimension for example, and reflection can thus be suppressed. This makes it possible to attain a transceiver which has stable oscillation characteristics, and provides high transmission output by virtue of insertion loss being kept lower. Moreover, it is possible to attain a transceiver which has stable wave detection characteristics, and provides high wave detection output by virtue of insertion loss being kept lower, as well as to enhance the reliability of a received high-frequency signal. Further, for example, the reliability of an intermediate-frequency signal produced by the mixer can be enhanced.

According to the transceiver in accordance with the sixth aspect of the invention, a high-frequency signal produced by the high-frequency oscillator is transmitted through the third transmission line to be fed to the first terminal of the branch, is fed from the second terminal of the branch to the fourth transmission line, and is eventually radiated from the transmitting antenna. Moreover, a high-frequency signal received by the receiving antenna is fed to the fifth transmission line and is then fed to the mixer. Further, the mixer receives a high-frequency signal produced by the high-frequency oscillator that has been transmitted through the third terminal of the branch and the sixth transmission line in the form of a local signal. The mixer mixes a high-frequency signal produced by the high-frequency oscillator and a high-frequency signal received by the receiving antenna to output intermediate-frequency signal. In this way, information included in the received high-frequency signal can be obtained.

The matching circuit is inserted into at least one of the third to sixth transmission lines so that one of a high-frequency signal from the high-frequency oscillator, a high-frequency signal from the branch, and a high-frequency signal caught by the receiving antenna pass therethrough. By doing so, impedance mismatch is not likely to occur even with variations in pattern dimension for example, and reflection can thus be suppressed. This makes it possible to attain a transceiver which has stable oscillation characteristics, and provides high transmission output by virtue of insertion loss being kept lower. Moreover, it is possible to attain a transceiver which has stable wave detection characteristics, and provides high wave detection output by virtue of insertion loss being kept lower, as well as to enhance the reliability of a received high-frequency signal. Further, for example, the reliability of an intermediate-frequency signal produced by the mixer can be enhanced.

According to the radar apparatus in accordance with the seventh aspect of the invention, on the basis of an intermediate-frequency signal from the transceiver, the distance detector detects the distance from the transceiver to an object to be detected. In this way, a distance to an object to be detected can be detected with high accuracy.

BRIEF DESCRIPTION OF DRAWINGS

Other and further objects, features, and advantages of the invention will be more explicit from the following detailed description taken with reference to the drawings wherein:

FIG. 4 is a Smith chart showing the plot of calculated values on the reflection coefficient of the matching circuit;

FIG. 5 is a model diagram of Example 1;

FIG. 6 is a chart in which the reflection coefficient |Γ| is plotted with respect to the variation ΔLp from the designed value Lp;

FIG. 7 is a perspective view showing a matching circuit 51 in accordance with a second embodiment;

FIG. 15 is a schematic diagram showing the configuration of a radar apparatus equipped with a transceiver in accordance with a sixth embodiment of the invention.

DESCRIPTION OF EMBODIMENT

Hereinafter, preferred embodiments of the invention will be described in detail with reference to the drawings.

Figure 1:
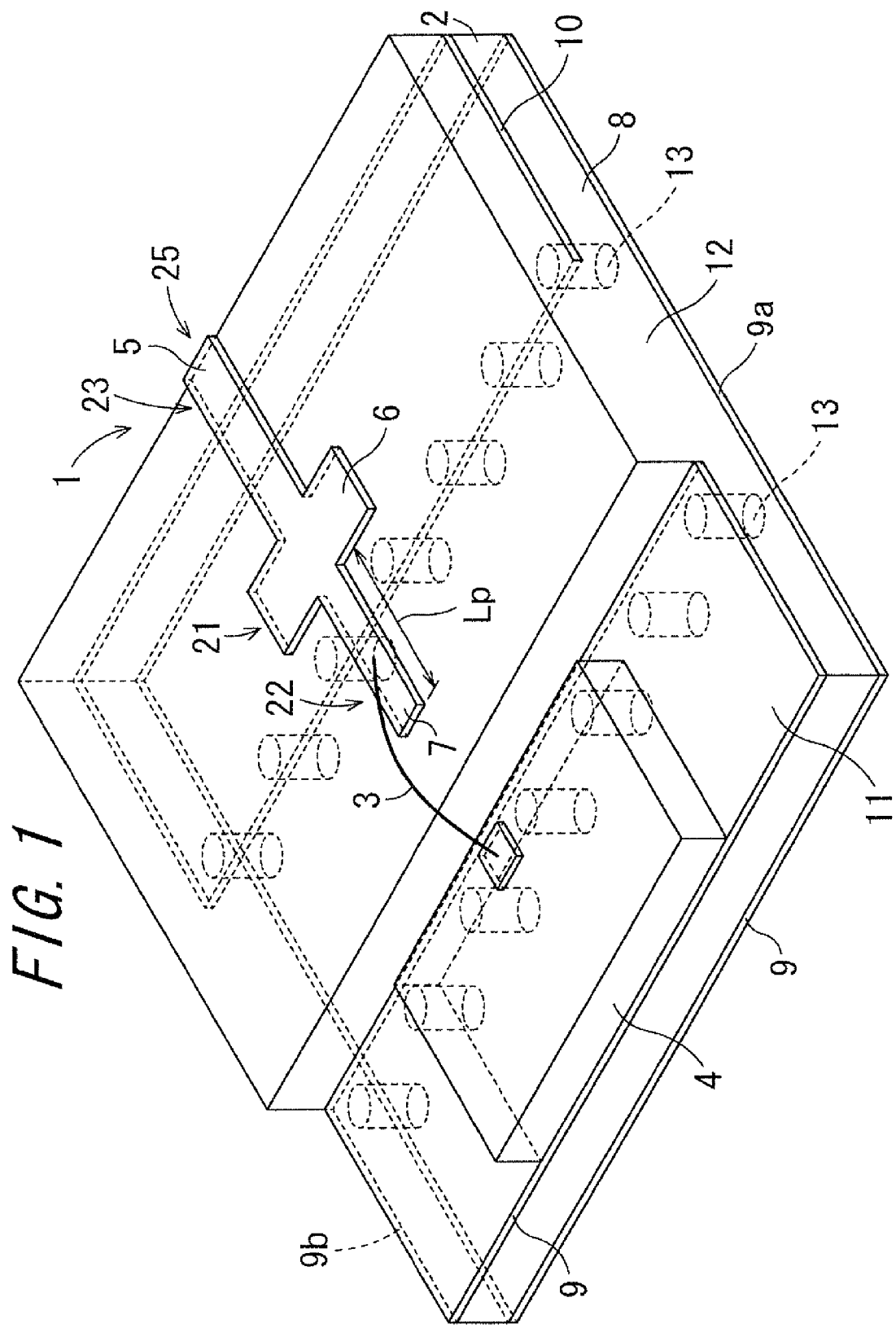
FIG. 1 is a perspective view showing a matching circuit in accordance with a first embodiment of the invention.
Figure 2:
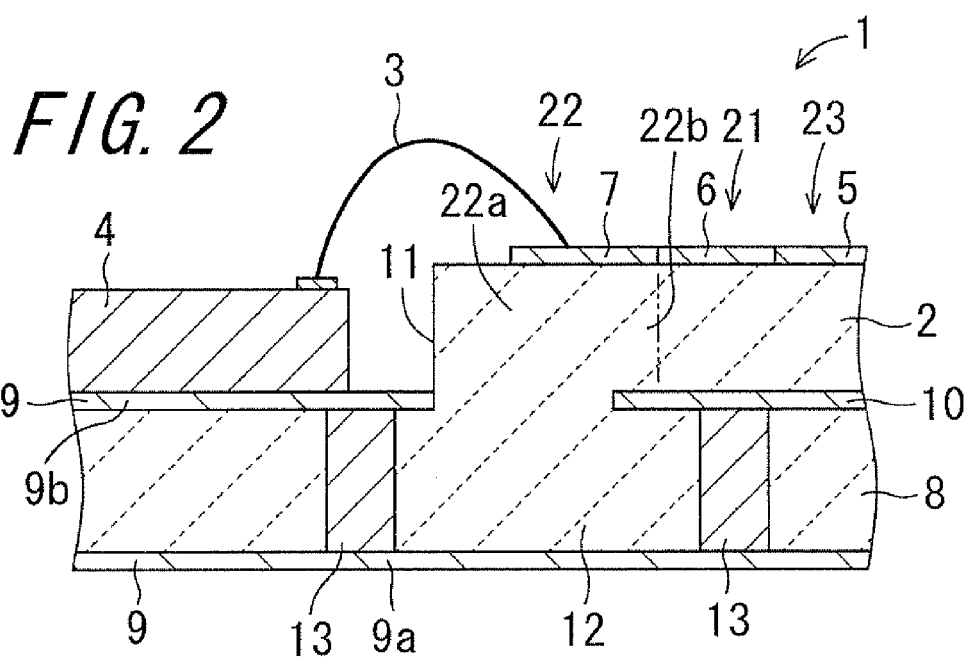
FIG. 2 is a sectional view showing the matching circuit.

FIG. 1 is a perspective view showing a matching circuit 1 in accordance with a first embodiment of the invention. FIG. 2 is a sectional view showing the matching circuit 1.

The matching circuit 1 is electrically connected to an electronic component 4 through a bonding wire 3. Examples of the electronic component 4 include a high-frequency oscillator, a mixer, and an amplifier, which are attained by using an MMIC respectively.

The matching circuit 1 is designed to achieve impedance matching in such a way that an electromagnetic wave inputted thereto from the electronic component 4 through the bonding wire 3 and an electromagnetic wave outputted therefrom to the electronic component 4 through the bonding wire 3 (hereafter referred to as "high-frequency signal") can compensate for reflection which occurs in the part of connection with the bonding wire 3. The bonding wire 3 is configured to have a length in a range of 300 μm to 700 μm and a diameter of 25 μm, approximately.

In this embodiment, the matching circuit 1 includes a transmission line portion 5, a stub portion 6, and a connection portion 7 that are continuous with one another to constitute a signal line 25 which is disposed on a surface of a wiring board 2.

The wiring board 2 is constructed by laminating, for example, a dielectric layer 8, a surface conductor layer 9, and an inner conductor layer 10 on top of one another.

In the matching circuit 1, the signal line 25 is coupled to the surface conductor layer 9 and the inner conductor layer 10 with the dielectric layer 8 interposed therebetween thereby to constitute a transmission line of microstrip structure. The surface conductor layer 9 and the inner conductor layer 10 function as a ground conductor layer. In this construction, the connection portion 7 is coupled to the surface conductor layer 9 and the inner conductor layer 10 with the dielectric layer 8 interposed therebetween thereby to constitute a first transmission line 22. The stub portion 6 is coupled to the inner conductor layer 10 with the dielectric layer 8 interposed therebetween thereby to constitute a reflection source 21. The transmission line portion 5 is coupled to the inner conductor layer 10 with the dielectric layer 8 interposed therebetween thereby to constitute a second transmission line 23. The first transmission line 22 has a first end 22a and a second end 22b, the first end 22a being connected with a load for use. The reflection source 21, which is a source of reflection of transmission signals resulting from the load connected to the first end 22a, is connected to the second end 22b and differs in form from the first transmission line 22. The second transmission line 23 is connected to the reflection source 21.

Moreover, in this embodiment, the electronic component 4 is placed in a recess (cavity) 11 of the wiring board 2. A peripheral part 12 of the wiring board except the cavity 11, is made larger in thickness than the other part of the board formed with the cavity 11.

On the opposite surface of the dielectric layer 8 from the surface formed with the cavity 11 for the placement of the electronic component 4; that is, the back surface, there is disposed a back conductor layer 9a acting as the surface conductor layer 9. In the inside of the dielectric layer 8 constituting the peripheral part 12 except the cavity 11, there is disposed the inner conductor layer 10.

The back conductor layer 9a and the inner conductor layer 10, as well as the back conductor layer 9a and a cavity conductor layer 9b acting as the surface conductor layer 9 formed in the cavity 11, are electrically connected to each other by a through conductor 13 passing through the dielectric layer 8 in its thickness direction. The back conductor layer 9a, the cavity conductor layer 9b, and the inner conductor layer 10 are connected to ground so as to serve as a so-called ground layer (ground conductor layer).

The impedance of the transmission line of microstrip structure is determined according to line form (line dimension), a distance to the ground layer (the thickness of the dielectric layer), the relative permittivity of the dielectric layer, and so forth. According to the construction of the conventional art, the matching circuit is attained by using a stub or the like. In this case, all of wiring lines extending from the connection part with the bonding wire, through the stub, to the transmission line, are coupled to the same ground layer, i.e., the inner conductor layer 10. That is, the conventional construction is so designed that all the wiring lines are at the same distance from the ground layer.

In contrast, the matching circuit of the present embodiment is so designed that the distance between the connection portion 7 and the ground layer varies halfway. More specifically, as the ground layer to be coupled to the connection portion 7, the back conductor layer 9a is coupled to a part of the connection portion 7 extending from one end to some midpoint, and on the other hand the inner conductor layer 10 is coupled to the rest of the connection portion 7 extending from the midpoint to the other end. The inner conductor layer 10 acts also as the ground layer to be connected to the transmission line portion 5 and the stub portion 6 as well.

Hence it follows that an impedance Za in a part of the first transmission line 22 which is formed by the coupling between the connection portion 7 and the back conductor layer 9a, an impedance Zb in a part of the first transmission line 22 which is formed by the coupling between the connection portion 7 and the inner conductor layer 10, an impedance Zc in the reflection source 21 formed by the coupling between the stub portion 6 and the inner conductor layer 10, an impedance Zd in the second transmission line 23 formed by the coupling between the transmission line portion 5 and the inner conductor layer 10, and an impedance Ze in the bonding wire differ from one another. That is, the first transmission line 22 possesses a variance area exhibiting characteristic impedance variation between the first end 22a and the second end 22b.

By virtue of such a structure, in the invention, it is possible to attain a matching circuit which is less prone to impedance mismatch even with variations in pattern dimension.

Although, as employed herein, the variance area exhibiting characteristic impedance variation is obtained by varying the distance between the connection portion 7 and the ground layer halfway, any other configuration can be adopted so long as it brings about a change in characteristic impedance. For example, a change in characteristic impedance can be effected by varying the permittivity of the dielectric between the connection portion 7 and the ground layer halfway or by inserting a film of different permittivity between them. Moreover, in the example shown in FIG. 1, the boundary area where the distance between the connection portion 7 and the ground layer varies is made uniformly in a direction perpendicular to a direction of transmission. Alternatively, by slanting or tapering the boundary area relative to the transmission direction, characteristic impedance can be varied gradually This is especially advantageous when unduly great reflection results from a load in the case where the boundary area is perpendicular to the transmission direction. That is, by varying characteristic impedance gradually, it is possible to make an adjustment to the magnitude of reflection and thereby achieve desired matching.

Moreover, with the provision of a plurality of notches in the connection portion 7, the same effects as achieved in a multiple stub can be obtained.

It is desirable to determine a distance from the load to the stub in such a way that an electromagnetic wave which has been inputted from the side of an external electronic component connected to a load and returned after being reflected from the load and an electromagnetic wave which has likewise been inputted from the external electronic component side, but passed through the load, and returned after being reflected from the stub are out of phase.

Figure 3A:
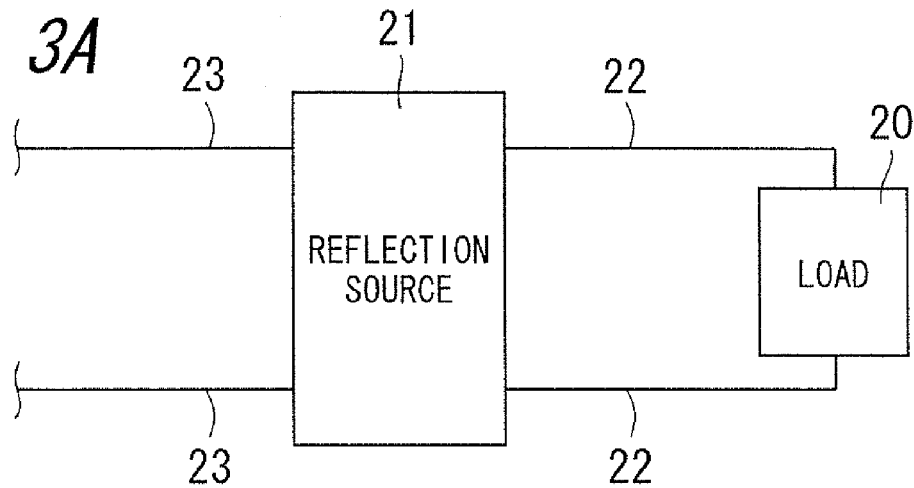
FIG. 3A is a diagram of a model of the matching circuit.
Figure 3B:
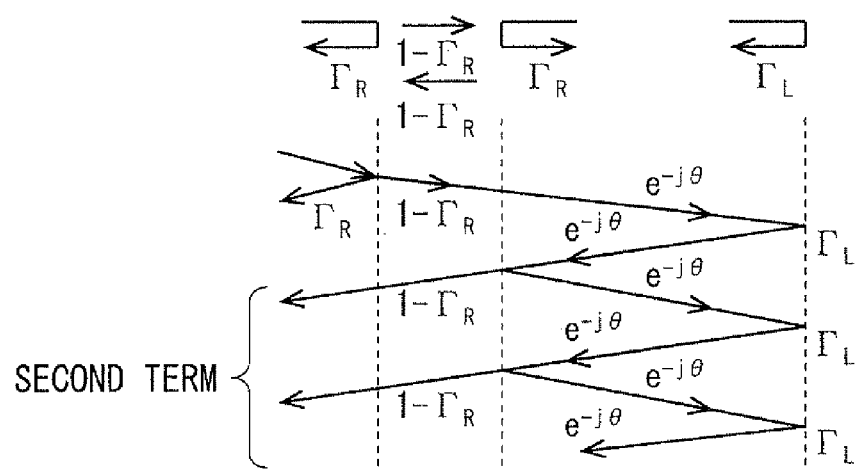
FIG. 3B is a diagram of a model of the matching circuit.

FIGS. 3A and 3B are diagrams of a model of the matching circuit. FIG. 4 is a Smith chart showing the plot of calculated values on the reflection coefficient of the matching circuit.

As has already been described, impedance matching for a load impedance different from the characteristic impedance of the transmission line is effected by the provision of the reflection source 21 such as a stub at some midpoint between the transmission lines 22 and 23 connected to a load 20 (refer to FIG. 3A). The impedance matching by the reflection source 21 is based on the following system.

Let it be assumed that the reflection coefficient of the load 20 is $\Gamma_L$, the value of the transmission coefficient of the transmission line between the reflection source 21 and the load 20 is 1, and the phase thereof is θ, and also the reflection coefficient by the reflection source 21 is represented as $\Gamma_R$ and the transmission coefficient is represented as $1-\Gamma_R$ for the sake of simplicity, then the overall reflection coefficient Γ will be expressed by the following expression (1):

$$\Gamma = \Gamma_R + (1-\Gamma_R)^2 \Gamma_L e^{-2j\theta} \sum_{n=0}^{\infty} (\Gamma_R \Gamma_L e^{-2j\theta})^n \quad (1)$$

When seeing to it that the overall reflection coefficient Γ equals 0, $\Gamma_R$ and θ are so determined that the right-hand member of the expression (1) take the value of 0.

It is noted that the second term in the right-hand member of the expression (1) corresponds to "SECOND TERM" shown in FIG. 3B.

Accordingly, in the matching circuit, for example, the pattern of the transmission line is so formed as to obtain $\Gamma_R$ and θ that make it possible for the right-hand member of the expression (1) to equate to 0. This, however, presents the problem that a deviation in pattern dimension from the designed value causes $\Gamma_R$ and θ to deviate from the desired specifications with a consequent increase of the value of Γ.

θ represents the phase of the transmission line between the reflection source 21 and the load 20, which is determined according to the pattern dimension, such as the width and length, of the transmission line. Now, attention is directed toward the level of Γ subjected to a shift of the phase θ.

The expression (1) is altered with use of the following expression (2) to derive the following expression (3).

$$\sum_{n=0}^{\infty} x^n = \frac{1}{1-x} \quad (2)$$

$$\Gamma = \frac{\Gamma_R + (1-2\Gamma_R)\Gamma_L e^{-2j\theta}}{1-\Gamma_R \Gamma_L e^{-2j\theta}} \quad (3)$$

The expression (3) is altered under a condition of Γ=0 to derive the following expression (4).

$$\Gamma_R = (2\Gamma_R - 1)\Gamma_L e^{-2j\theta} \quad (4)$$

With the absolute values in both members of the expression (4) taken up, $|2\Gamma_R - 1|$ is assumed to 1, then the condition of $|\Gamma_R|=|\Gamma_L|$ holds. It will thus be seen that, the larger is $|\Gamma_L|$, the more necessary it becomes to increase $|\Gamma_R|$. That is, the larger the reflection coefficient $\Gamma_L$ of the load 20 becomes, the more necessary it becomes to increase the coefficient $\Gamma_R$ of reflection by the reflection source 21.

As will be seen in the expression (1) plotted on the Smith chart shown in FIG. 4, the condition of Γ=0 holds so long as the second term is the same as the first term $\Gamma_R$ in terms of magnitude but is opposite to the first term $\Gamma_R$ in terms of phase.

When the phase θ is deviated from the designed value, there arises a turn of the second term with a consequent increase of Γ. At this time, even if the shift of the phase θ remains the same, the smaller $|\Gamma_R|(=|\Gamma_L|)$ becomes, the smaller Γ becomes.

In FIG. 4, a chart 30 and a chart 31 are in 3° out-of-phase θ relation to each other, and so are a chart 32 and a chart 33. The charts 30 and 32 each indicate a case where the condition of Γ=0 holds.

The chart 30 and the chart 31 each indicate a case where $|\Gamma_R|$ takes a small value, whereas the chart 32 and the chart 33 each indicate a case where $|\Gamma_R|$ takes a large value. Given $|\Gamma_R|$ of a small value, variation of Γ can be minimized in the case of the chart 31 exhibiting a 3° out-of-phase θ relation. On the other hand, given $|\Gamma_R|$ of a large value, Γ varies greatly in the case of the chart 33 exhibiting the 3° out-of-phase θ relation, with a consequent significant reflection resulting from impedance mismatch.

The phase θ is determined according to the pattern dimension including width and length of the transmission line. Therefore, even if a shift of the phase θ arises due to variations in pattern dimension, so long as the value of $|\Gamma_R|(=|\Gamma_L|)$ is small, a matching circuit insensitive to the variations in pattern dimensions can be attained.

Looking at the matching circuit 1 shown in FIGS. 1 and 2, the load involves the bonding wire 3 configured to connect the electronic component 4 and the connection portion 7. In this case, by appropriately setting the location where the distance to the ground layer varies (the position of the end of the inner conductor layer 10), it is possible to make the value of $|\Gamma_L|$ representing the reflection by the load smaller than would be obtained in the case of rendering the distance to the ground layer uniform, and thereby attain a matching circuit which is less prone to impedance mismatch even with variations in pattern dimension. Moreover, the distance between the connection portion 7 and the back conductor layer 9a acting as the ground layer is longer than the distance between the inner conductor layer 10 acting as the ground layer and the transmission line portion 5 as well as the stub portion 6. This makes it possible to increase the characteristic impedance Za at the connection portion 7 and thereby reduce the reflection caused by the bonding wire; that is, decrease the value of $|\Gamma_L|$. As a result, a matching circuit which is less prone to impedance mismatch even with variations in pattern dimension can be attained.

The advantageous effects of the first embodiment will be described using computational results obtained by means of electromagnetic-field analysis simulator.

A model of the matching circuit 1 shown in FIGS. 1 and 2 has been formulated by way of Example 1. FIG. 5 is a model diagram of Example 1. The transmission line portion 5, the stub portion 6, and the connection portion 7 and the wiring board 2 constituting the matching circuit, the bonding wire 3, and the electronic component 4 are each given dimensions as shown in FIG. 5. It is noted that the transmission line portion 5, the stub portion 6, the connection portion 7, the bonding wire 3, the back conductor layer 9a, the cavity conductor layer 9b, the inner conductor layer 10, and the through conductor 13 are each made as a perfect conductor. Moreover, the relative permittivity ∈r of the dielectric layer 8 is set at 9.75.

The distance between the connection portion 7 and the back conductor layer 9a is set at 0.30 mm. The distance between the transmission line portion 5 as well as the stub portion 6 and the inner conductor layer 10 is set at 0.15 mm.

Moreover, the structure of Comparative Example 1 has been prepared that has basically the same structure as that of Example 1, except that the inner conductor layer 10 and the cavity conductor layer 9b are connected to each other, and that the inner conductor layer 10 is coupled, as the ground layer, to the connection portion 7. Thus, the distance between the connection portion 7 and the ground layer and the distance between the transmission line portion 5 as well as the stub portion 6 and the ground layer are the same; that is, 0.15 mm, which is the distance to the inner conductor layer 10.

The length of the connection portion 7 in the direction of signal transmission is represented as Lp. The length Lp is varied to examine the influence of pattern dimension deviation. More specifically, on the basis of the length Lp which is the designed value (=0.433 mm), the variation of length from Lp is represented as ΔLp. Then, in each of Example 1 and Comparative Example 1, the reflection coefficient |Γ| has been derived for each of a case where ΔLp is ±0.01 mm and a case where ΔLp is ±0.02 mm.

It is noted that a load employed in each of Example 1 and Comparative Example 1 is the bonding wire 3 connected to an electronic component (semiconductor chip) having a 50Ω output impedance.

FIG. 6 is a chart in which the reflection coefficient |Γ| is plotted with respect to the variation ΔLp from the designed value Lp. In the chart, the axis of abscissa represents ΔLp, and the axis of ordinate represents |Γ|. A polygonal line 40 indicates the reflection coefficient of Example 1, and a polygonal line 41 indicates the reflection coefficient of Comparative Example 1.

In Comparative Example 1, the calculated value of the reflection coefficient as observed from the first transmission line 22 including the connection portion 7 connected to the bonding wire 3 (characteristic impedance: 53Ω) is given as: $|Γ_L|=-2.6$ dB (77 GHz). Impedance matching is made by providing the stub portion 6 constituting the reflection source 21 at a position spaced the distance Lp away from an end of the connection portion 7.

In Comparative Example 1, as shown in FIG. 6, in the case where ΔLp is ±0.02 mm, the reflection coefficient at 77 GHz is 0.28 at the maximum (−11 dB).

In Example 1, the characteristic impedance of the first transmission line 22 including the connection portion 7 connected to the bonding wire 3 is 62Ω, and this value is greater than would be obtained in Comparative Example 1. Correspondingly the reflection coefficient as observed from the first transmission line 22 including the connection portion 7 is given as: $|Γ_L|=-3.6$ dB (77 GHz).

In a region between the bonding wire 3 and the reflection source 21 including the stub portion 6, the distance between the stub portion 6 and the ground layer is decreased. By selecting this distance appropriately, it is possible to lower the reflection coefficient. In Example 1, the reflection coefficient is given as: $|Γ_L|=-6.1$ dB at 77 GHz.

Accordingly, the value of the reflection coefficient of the reflection source 21 including the stub portion 6 connected to the first transmission line 22 including the connection portion 7 is smaller than would be obtained in Comparative Example 1 as is desirable.

In Example 1, as shown in FIG. 6, in the case where ΔLp is ±0.02 mm, the reflection coefficient at 77 GHz is 0.12 at the maximum (−18 dB).

It will thus be seen that, in contrast to the construction of the conventional art, the matching circuit is less prone to impedance mismatch even with variations in pattern dimension.

Next, a second embodiment of the invention will be described.

Although, in the first embodiment, the load is illustrated as being the bonding wire, it is not so limited but may be of another element. For example, elements that lead to unnecessary reflection including a chip component such as a chip resistor, a flip-chip mounting component such as a diode or IC, a connector for use in an antenna or the like, and a circuit element such as a branching circuit or a filter are applicable.

A load employed in the second embodiment is a portion 67 obtained by coupling a stepped portion (stub portion) formed in some midpoint of a transmission line with an inner conductor layer 60 which will hereafter be described.

FIG. 7 is a perspective view showing a matching circuit 51 implemented by way of the second embodiment.

The matching circuit 51 is electrically connected to an other transmission line portion 54 through a stepped portion 53. In this embodiment, the matching circuit 51 includes a transmission line portion 55, a stub portion 56, and a connection portion 57 that are continuous with one another to constitute a signal line 68 which is disposed on a surface of a wiring board 52.

The wiring board 52 is constructed by laminating together a dielectric layer 58, a surface conductor layer 59, and an inner conductor layer 60, for example.

In the matching circuit 51, the signal line 68 is coupled to the surface conductor layer 59 and the inner conductor layer 60 with the dielectric layer 8 interposed therebetween thereby to constitute a transmission line of microstrip structure. The surface conductor layer 59 and the inner conductor layer 60 function as a ground conductor layer. In this construction, the connection portion 57 is coupled to the surface conductor layer 59 and the inner conductor layer 60 with the dielectric layer 58 interposed therebetween thereby to constitute a first transmission line 64. The stub portion 56 is coupled to the surface conductor layer 59 with the dielectric layer 58 interposed therebetween thereby to constitute a reflection source 65. The transmission line portion 55 is coupled to the surface conductor layer 59 with the dielectric layer 58 interposed therebetween thereby to constitute a second transmission line 66. The first transmission line 64 has a first end 64a and a second end 64b, the first end 64a being connected with a load for use. The reflection source 65, which is a source of transmission signal reflection resulting from the load connected to the first end 64a, is connected to the second end 64b and differs in form from the first transmission line 64. The second transmission line 66 is connected to the reflection source 65.

Moreover, in this embodiment, the transmission line portion 54 is, just like the signal line 68, disposed on the surface of the wiring board 2.

On the opposite surface of the dielectric layer 58 from the surface formed with the signal line 68 and the transmission line portion 54; that is, the back surface, there is disposed a back conductor layer 59a acting as the surface conductor layer 59. Moreover, in the inside of a part of the dielectric layer 58 which is formed with the stepped portion 53 and the transmission line portion 54, there is disposed the inner conductor layer 60.

The back conductor layer 59a and the inner conductor layer 60 are electrically connected to each other by a through conductor 63 passing through the dielectric layer 58 in its thickness direction. The back conductor layer 59a and the inner conductor layer 60 are connected to ground so as to serve as a ground layer (ground conductor layer).

In the case of attaining a matching circuit by using a stub or the like as is the case with the conventional art, all of wiring lines including the matching circuit 51, the stepped portion 53, and the other transmission line portion 54 are coupled to the same ground layer, i.e., the back conductor layer. That is, in this construction, all the wiring lines are at the same distance from the ground layer.

In contrast, the matching circuit 51 of the present embodiment is so designed that the distance from one line portion 57a, which is a part of the connection portion 57 at the side of the stub portion 56, as well as the transmission line portion 55 and the stub portion 56, to the ground layer and the distance from the other line portion 57b, which is a part of the connection portion 57 at the side of the stepped portion 53, as well as the stepped portion 53 and the other transmission line portion 54, to the ground layer differ from each other. More specifically, the back conductor layer 59a acts as the ground layer to be coupled to one line portion 57a of the connection portion 57 located toward the stub portion 56, the transmission line portion 55, and the stub portion 56. On the other hand, the inner conductor layer 60 acts as the ground layer to be coupled to the other line portion 57b of the connection portion 57 located toward the stepped portion 53, the stepped portion 53, and the other transmission line portion 54.

In contrast to the second embodiment, the construction of the conventional art is so designed that all the wiring lines are at the same distance from the ground layer. This distance is equal to the distance to the inner conductor layer 60 set for this embodiment. That is, in the second embodiment, the distance from one line portion 57a of the connection portion 57 located toward the stub portion 56, as well as the transmission line portion 55 and the stub portion 56, to the ground layer coupled thereto is twice as long as the distance between the wiring line and the ground layer set for the conventional construction.

In this way, an impedance Za in that part of the first transmission line 64 which is formed by the coupling between one line portion 57a of the connection portion 57 and the back conductor layer 59a, an impedance Zb in a part of the first transmission line 64 which is formed by the coupling between the other line portion 57b of the connection portion 57 and the inner conductor layer 60, an impedance Zc in the reflection source 65 formed by the coupling between the stub portion 56 and the back conductor layer 59a, an impedance Zd in the second transmission line 66 formed by the coupling between the transmission line portion 55 and the back conductor layer 59a, and an impedance Ze in the portion 67 formed by the coupling between the stepped portion 53 acting as the load and the inner conductor layer 60 differ from one another. That is, the first transmission line 64 possesses a variance area exhibiting characteristic impedance variation between the first end 64a and the second end 64b.

By virtue of such a structure, in the invention, it is possible to attain a matching circuit which is less prone to impedance mismatch even with variations in pattern dimension.

Just as with the first embodiment, the advantageous effects of the second embodiment will be described using computational results obtained by means of electromagnetic-field analysis simulator.

Figure 8:
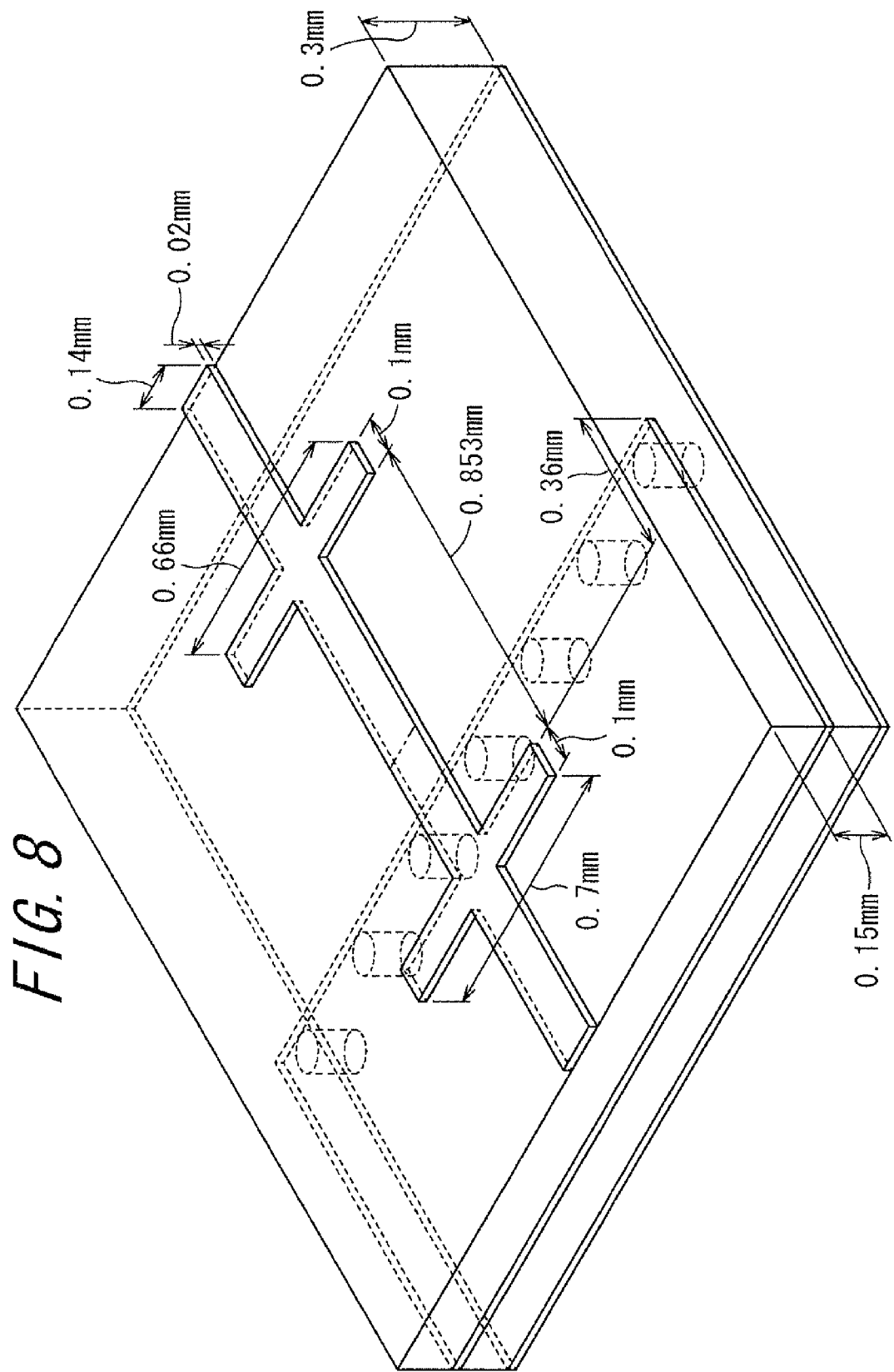
FIG. 8 is a model diagram of Example 2.

A model of the matching circuit 51 shown in FIG. 7 has been formulated by way of Example 2. FIG. 8 is a model diagram of Example 2. The transmission line portion 55, the stub portion 56, and the connection portion 57 constituting the matching circuit 51, and the wiring board 52, the stepped portion 53, and the other transmission line portion 54 are each given dimensions as shown in FIG. 8. It is noted that the transmission line portion 55, the stub portion 56, the connection portion 57, the stepped portion 53, the other transmission line portion 54, the back conductor layer 59a, the inner conductor layer 60, and the through conductor 63 are each made as a perfect conductor. Moreover, the relative permittivity ∈r of the dielectric layer 58 is set at 9.75.

The distance from one line portion 57a of the connection portion 57 located toward the stub portion 56, as well as the transmission line portion 55 and the stub portion 56, to the back conductor layer 59a is set at 0.30 mm. The distance from the other line portion 57b of the connection portion 57 located toward the stepped portion 53, as well as the stepped portion 53 and the other transmission line portion 54, to the inner conductor layer 60 is set at 0.15 mm.

Moreover, the structure of Comparative Example 2 has been prepared that has basically the same structure as that of Example 2, except that the distance between the matching circuit 51 and the ground layer, the distance between the stepped portion 53 and the ground layer, and the distance between the other transmission line portion 54 and the ground layer are the same; that is, set at 0.15 mm.

The length of the connection portion 57 in the direction of signal transmission is represented as Lp. The length Lp is varied to examine the influence of pattern dimension deviation. More specifically, on the basis of the length Lp which is the designed value (=0.853 mm), the variation of length from Lp is represented as ΔLp. Then, in each of Example 2 and Comparative Example 2, the reflection coefficient |Γ| has been derived for each of a case where ΔLp is ±0.02 mm and a case where ΔLp is ±0.03 mm.

It is noted that a load employed in each of Example 2 and Comparative Example 2 is the portion 67 formed by the coupling between the stepped portion 53 and the inner conductor layer 60. The 0.1 mm-wide and 0.7 mm-long stepped portion 53 is formed in some midpoint of the 0.1 mm-wide transmission line (characteristic impedance: 47Ω).

Figure 9:
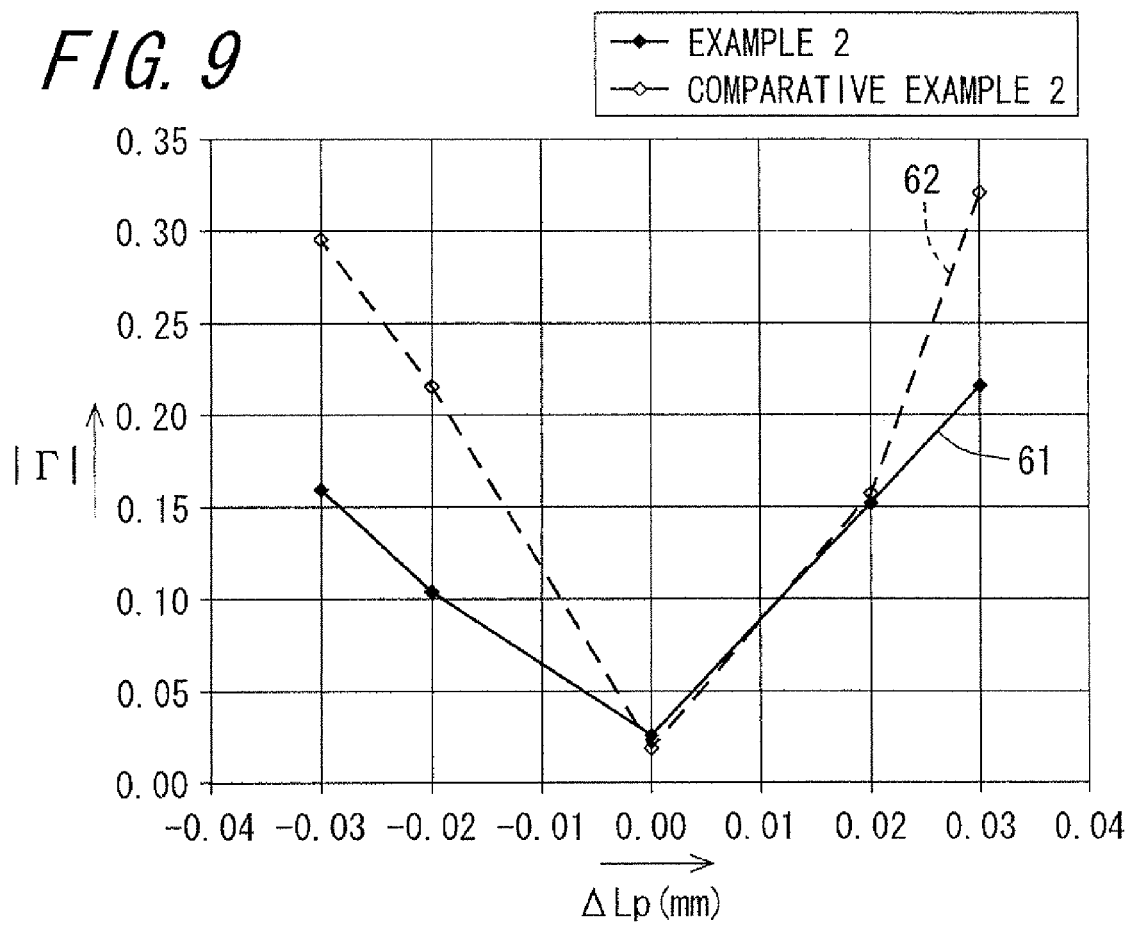
FIG. 9 is a chart in which the reflection coefficient |Γ| is plotted with respect to the variation ΔLp from the designed value Lp.

FIG. 9 is a chart in which the reflection coefficient |Γ| is plotted with respect to the variation ΔLp from the designed value Lp. In the chart, the axis of abscissa represents ΔLp, and the axis of ordinate represents |Γ|. A polygonal line 61 indicates the reflection coefficient of Example 2, and a polygonal line 62 indicates the reflection coefficient of Comparative Example 2.

In Comparative Example 2, the calculated value of the reflection coefficient as observed from the load 67 including the stepped portion 53 at the connection portion 57 is given as $|Γ_L|$=−3.3 dB (76.5 GHz). Impedance matching is made by providing the stub portion 56 constituting the reflection source 65 in a position spaced the distance Lp away from the stepped portion 53.

In Comparative Example 2, as shown in FIG. 9, in the case where ΔLp is ±0.03 mm, the reflection coefficient at 76.5 GHz is 0.32 at the maximum (−9.9 dB).

In Example 2, the distance between the connection portion 57 and the ground layer varies halfway in the signal transmission direction. That is, the distance between one line portion 57a and the back conductor layer 59a acting as the ground layer is 0.30 mm, whereas the distance between the other line portion 57b and the inner conductor layer 60 acting as the ground layer is 0.15 mm. By selecting the distance to the ground layer and the lengths of one line portion 57a and the other line portion 57b appropriately, it is possible to lower the reflection coefficient. In Example 2, the reflection coefficient is given as $|Γ_L|$=−5.7 dB at 76.5 GHz.

Accordingly, it is desirable that the value of the reflection coefficient of the reflection source 65 including the stub portion 6 connected to the connection portion 7 is smaller than that would be obtained in Comparative Example 1.

In Example 2, as shown in FIG. 9, in the case where ΔLp is ±0.03 mm, the reflection coefficient at 76.5 GHz is 0.22 at the maximum (−13 dB).

It will thus be seen that, in contrast to the construction of the conventional art, the matching circuit is less prone to impedance mismatch even with variations in pattern dimension.

Next, the advantageous effects of the first embodiment will be described using experimental results.

Figure 10:
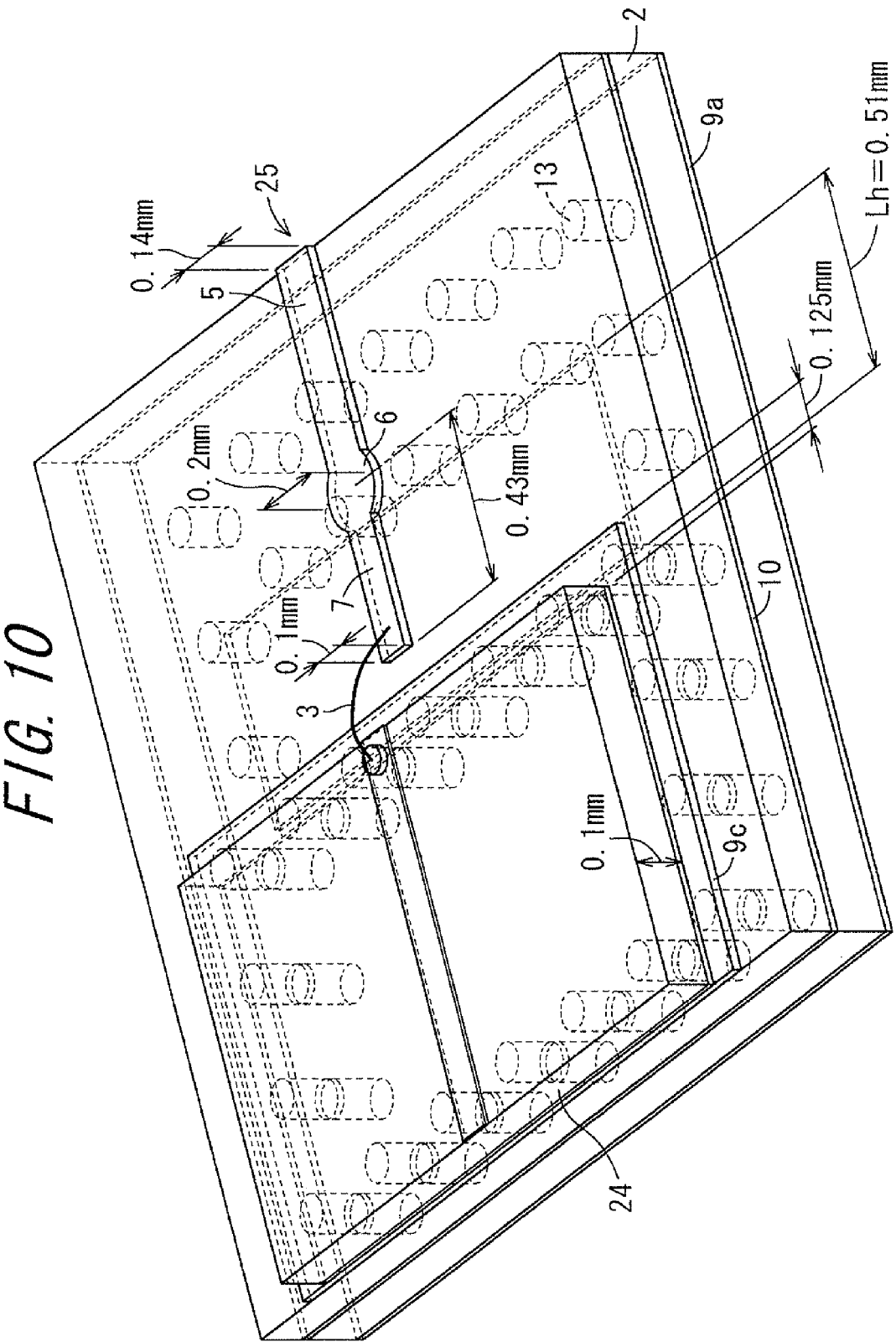
FIG. 10 is a model diagram of Example 3.

A matching circuit 1 as shown in FIG. 10 has been constructed by way of Example 3. A transmission line portion 5, a stub portion 6, and a connection portion 7 constituting the matching circuit, and a wiring board 2, a bonding wire 3, and a dummy chip 24 provided with a pad for probing (not shown) used for evaluation instead of an electronic component are each given dimensions as shown in FIG. 10. It is noted that the transmission line portion 5, the stub portion 6, the connection portion 7, the bonding wire 3, a back conductor layer 9a, a die attach conductor layer 9c, an inner conductor layer 10, and a through conductor 13 are each constructed of a tungsten-metallized component. Moreover, alumina is used to form a dielectric layer 8.

The distance between the connection portion 7 and the back conductor layer 9a is set at 0.30 mm. The distance between the transmission line portion 5, as well as the stub portion 6, and the inner conductor layer 10 is set at 0.15 mm.

The distance (length) from an end of the die attach conductor layer 9c to an end of a notch of the inner conductor layer 10 is represented as Lh, and the length Lh is varied to cause pattern variations. The influence of pattern dimension deviation has been examined by measuring the reflection coefficient of the varied pattern. More specifically, on the basis of the length Lh which is the designed value (=0.51 mm), the variation of length from Lh is represented as ΔLh. Then, the reflection coefficient has been measured for a case where ΔLh is ±0.05 mm.

In order to derive the reflection coefficient, the dummy chip is subjected to probing using a probe connected to Port 1 of a network analyzer, and termination is achieved by placing an electric wave absorber on a line extending from the transmission line portion 5. Under this condition, measurement of S11 is conducted to derive the reflection coefficient |S11|.

It is noted that the load employed in Example 3 is the bonding wire 3 connected to the dummy chip having a 50Ω output impedance.

Figure 11:
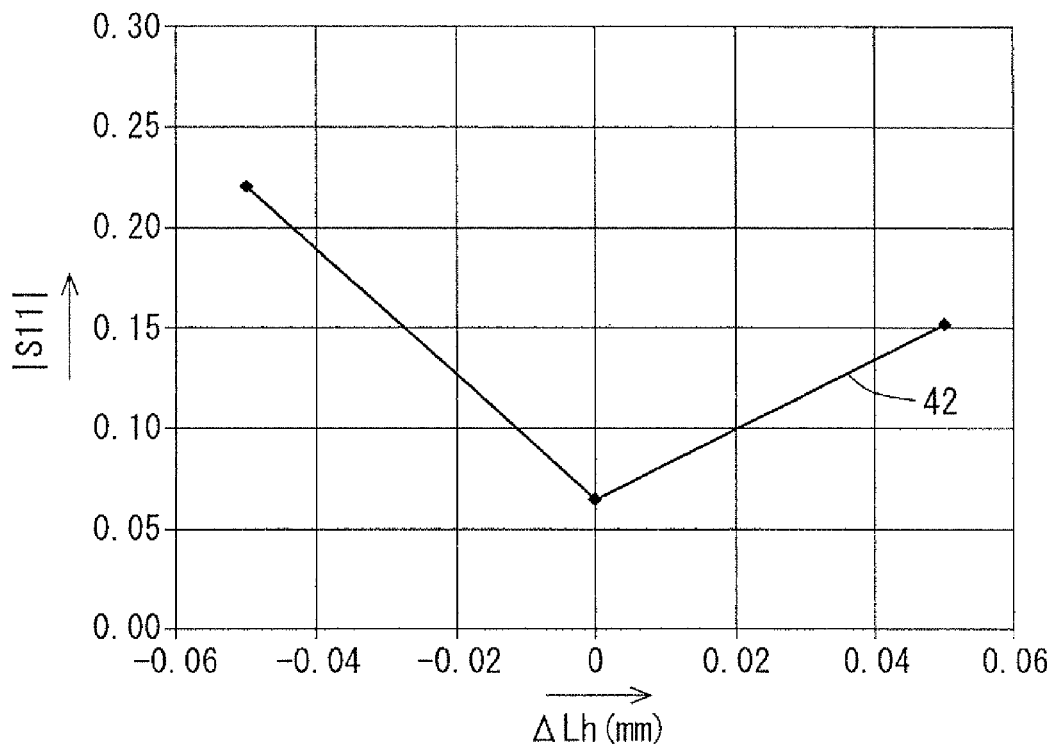
FIG. 11 is a chart in which a reflection coefficient |S11| is plotted with respect to a variation ΔLh from a designed value Lh.

FIG. 11 is a chart in which the reflection coefficient |S11| is plotted with respect to the variation ΔLh from the designed value Lh at 77 GHz. In the chart, the axis of abscissa represents ΔLh, and the axis of ordinate represents |S11|. A polygonal line 42 indicates the reflection coefficient of Example 3. In the case where ΔLh is ±0.05 mm, the reflection coefficient at 77 GHz is 0.22 at the maximum (−13 dB). It will thus be seen that the matching circuit is less prone to impedance mismatch even with variations in pattern dimension.

Now, the materials of construction of the matching circuit 1, 51 of the invention will be explained.

The dielectric layer 8, 58 is made of a dielectric having electrical insulation properties, specifically, glass, single crystal, ceramic, resin, or a composite of such substances. Examples of usable glass include quartz glass and crystallized glass. Examples of usable single crystal include Si, GaAs, crystal, sapphire, MgO, and $LaAlO_3$. Examples of usable ceramic include alumina, aluminum nitride, glass ceramic, forsterite, and cordierite. Examples of usable resin include epoxy resin, fluorine-containing resin, and liquid crystal polymer. The dielectric layer 8, 58 is embodied in the form of a single-layer substrate or a multi-layer substrate. In the case of adopting the multi-layer form, the thickness of each layer in its thickness direction Z is so selected as to fall in a range of 50 μm to 250 μm.

The conductors including the transmission line portion 5, 55, the stub portion 6, 56, the connection portion 7, 57, the surface conductor layer 9, 59, the inner conductor layer 10, 60, and the through conductor 13, 63 are made mainly of electrically conductive metal such as Cu (copper), Ag (silver), W (tungsten), Mo (molybdenum), Al (aluminum), Ni (nickel), and Au (gold).

Figure 12:
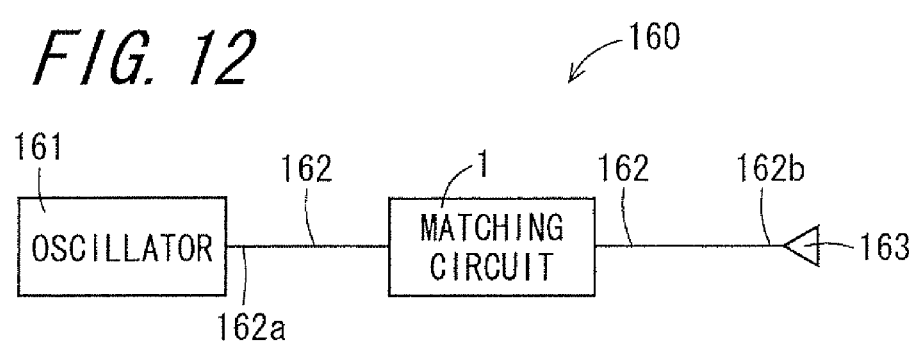
FIG. 12 is a schematic diagram showing the configuration of a transmitter in accordance with a third embodiment of the invention.

FIG. 12 is a schematic diagram showing the configuration of a transmitter 160 in accordance with a third embodiment of the invention. The transmitter 160 comprises the above-mentioned matching circuit 1 of the first embodiment shown in FIG. 1, a high-frequency oscillator 161, a transmission line 162 which is a transmission line for to-be-transmitted signals, and a transmitting antenna 163. The high-frequency oscillator 161 comprises a Gunn oscillator utilizing a Gunn diode or an IMPATT oscillator utilizing an IMPATT diode, or an MMIC (Microwave Monolithic Integrated Circuit) oscillator utilizing a transistor such as FET (Field Effect Transistor), and produces high-frequency signals. The transmission line 162 is constructed of a microstrip line or a strip line, or a coplanar line. A first end 162a of the transmission line 162 in the direction of high-frequency signal transmission is connected to the high-frequency oscillator 161, and a second end 162b of the transmission line 162 in a high-frequency signal transmission direction is connected to the transmitting antenna 163. The transmitting antenna 163 is attained by using a patch antenna or a horn antenna. The high-frequency signal transmission direction is a direction of electromagnetic wave propagation. Although the first end 162a is constructed of a microstrip line or a strip line, or a coplanar line, it may be constructed of a bonding wire 3 for electrically connecting the high-frequency oscillator 161 and the matching circuit 1.

The matching circuit 1 is inserted into the transmission line 162 so that high-frequency signals pass therethrough. More specifically, the transmission line 162 is constructed of the bonding wire 3, and the transmission line portion 5 is connected to the transmitting antenna 163.

A high-frequency signal produced by the high-frequency oscillator 161 passes through the transmission line 162 and the matching circuit 1 to be fed to the transmitting antenna 163, and is then radiated from the transmitting antenna 163 as electric waves.

In this way, with the insertion of the matching circuit 1 into the transmission line 162, it is possible to achieve impedance matching readily while minimizing reflection even if variations of pattern dimension occur, and thereby attain the transmitter 160 capable of providing high transmission output with low loss.

Although the transmitter 160 employs the matching circuit 1, the above-mentioned matching circuit 51 of the second embodiment may be employed. Even if the matching circuit 51 is used, the same effects can be gained. Moreover, in the transmitter 160, aside from a microstrip line and a strip line, a coplanar line, a coplanar line with ground, a slot line, a waveguide, or a dielectric waveguide can be used to attain the transmission line 162.

Figure 13:
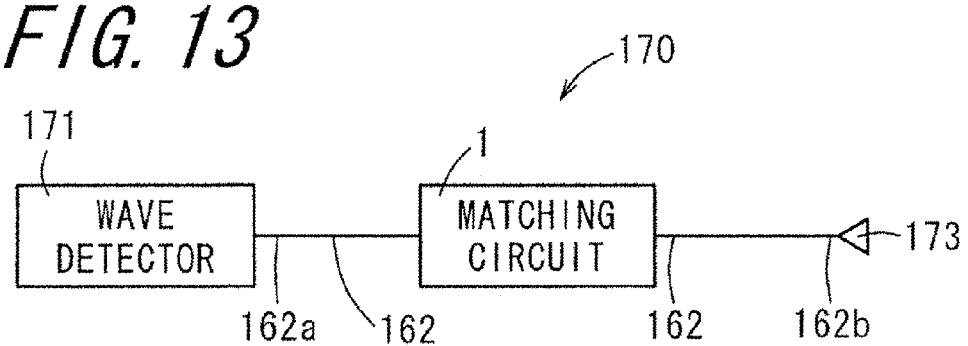
FIG. 13 is a schematic diagram showing the configuration of a receiver in accordance with a fourth embodiment of the invention.

FIG. 13 is a schematic diagram showing the configuration of a receiver 170 in accordance with a fourth embodiment of the invention. The constituent components of the receiver 170 that play the same or corresponding roles as in the above-mentioned transmitter 160 shown in FIG. 12 will be identified with the same reference signs, and overlapping descriptions may be omitted.

The receiver 170 comprises the above-mentioned matching circuit 1 of the first embodiment, a high-frequency wave detector 171, a transmission line 162 which is a transmission line for received signals, and a receiving antenna 173. The high-frequency wave detector 171 is attained by using a Schottky barrier diode detector, a video detector, a mixer MMIC, or the like.

A first end 162a of the transmission line 162 in the high-frequency signal transmission direction is connected to the high-frequency wave detector 171, and a second end 162b of the transmission line 162 in the high-frequency signal transmission direction is connected to the receiving antenna 173. The receiving antenna 173 is attained by using a planar antenna such as a patch antenna, a horn antenna, a rod antenna, or the like.

The matching circuit 1 is inserted into the transmission line 162 so that high-frequency signals pass therethrough.

Upon acquisition of externally-coming electric waves, the receiving antenna 173 provides high-frequency signals based on the electric waves to the transmission line 162, and the received high-frequency signal passes through the matching circuit 1 to be fed to the high-frequency wave detector 171. The high-frequency wave detector 171 effects wave detection on the high-frequency signal to detect information included in the high-frequency signal.

In the receiver 170, a high-frequency signal caught by the receiving antenna 173 is transmitted to the transmission line 162 and is then wave-detected by the high-frequency wave detector 171.

In this way, with the insertion of the matching circuit 1 into the transmission line 162, it is possible to achieve impedance matching readily while minimizing reflection even if variations of pattern dimension occur, and thereby attain the receiver 170 capable of providing high wave detection output with low loss.

Although the receiver 170 employs the matching circuit 1, the above-mentioned matching circuit 51 of the second embodiment may be employed instead of the matching circuit 1. Even if the matching circuit 51 is used, the same effects can be gained. Moreover, in the receiver 170, aside from a microstrip line and a strip line, a coplanar line, a coplanar line with ground, a slot line, a waveguide, or a dielectric waveguide can be used to attain the transmission line 162.

Figure 14:
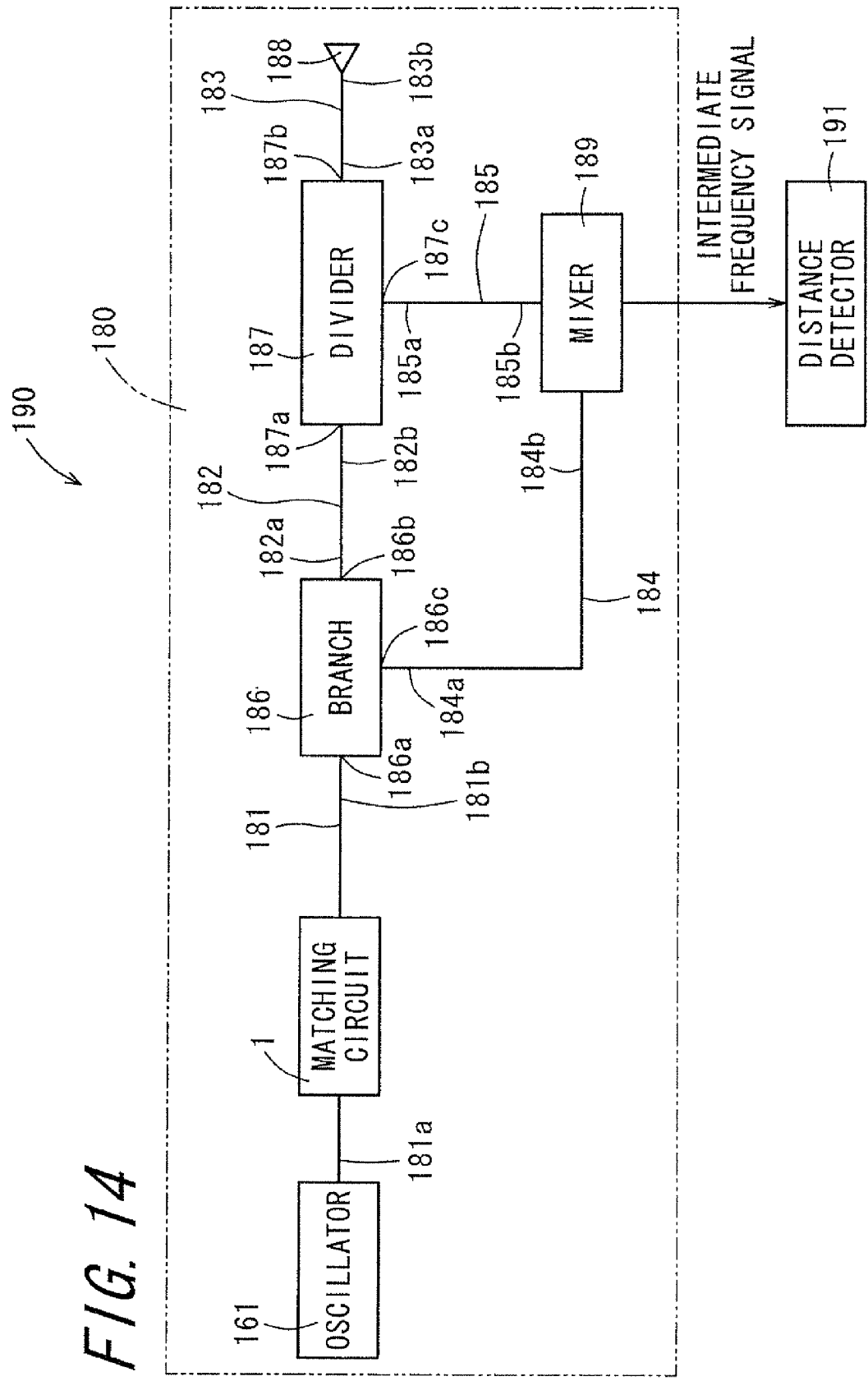
FIG. 14 is a schematic diagram showing the configuration of a radar apparatus equipped with a transceiver in accordance with a fifth embodiment of the invention.

FIG. 14 is a schematic diagram showing the configuration of a radar apparatus 190 equipped with a transceiver 180 in accordance with a fifth embodiment of the invention. The constituent components of the radar apparatus 190 that play the same or corresponding roles as in the transmitter 160 and the receiver 170 of the preceding embodiments shown in FIGS. 12 and 13 will be identified with the same reference signs, and overlapping descriptions may be omitted. The radar apparatus 190 comprises the transceiver 180 and a distance detector 191.

The transceiver 180 comprises the above-mentioned matching circuit 1 of the first embodiment, a high-frequency oscillator 161, third to seventh transmission lines 181, 182, 183, 184, and 185, a branch 186, a divider 187, a transceiving antenna 188, and a mixer 189. The transceiving antenna 188 is attained by using a patch antenna or a horn antenna. The third to seventh transmission lines 181, 182, 183, 184, and 185 have the same configuration as that of the transmission line 162.

A first end 181*a* of the third transmission line 181 in the high-frequency signal transmission direction is connected to the high-frequency oscillator 161, and a second end 181*b* of the third transmission line 181 in the high-frequency signal transmission direction is connected to the branch 186. The matching circuit 1 is inserted into the third transmission line 181 so that high-frequency signals pass therethrough.

The branch (switch) 186 has a first terminal 186*a*, a second terminal 186*b*, and a third terminal 186*c*, and by which high-frequency signals fed to the first terminal 186*a* are selectively outputted to the second terminal 186*b* or the third terminal 186*c*. The branch 186 is attained by using a high-frequency switch element, for example. When a control signal is fed from a control section (not shown) to the branch 186, on the basis of the control signal, the connection between the first terminal 186*a* and the second terminal 186*b* or the connection between the first terminal 186*a* and the third terminal 186*c* is selectively established. The radar apparatus 190 is attained by using a pulse radar. Under the control of the control section, the first terminal 186*a* and the second terminal 186*b* are connected to each other to output a pulsed high-frequency signal from the second terminal 186*b*, and whereafter the first terminal 186*a* and the third terminal 186*c* are connected to each other to output a high-frequency signal from the third terminal 186*c*. The second terminal 186*b* is connected with a first end 182*a* of the fourth transmission line 182 in the high-frequency signal transmission direction. The third terminal 186*c* is connected with a first end 184*a* of the fourth transmission line 184 in the high-frequency signal transmission direction. The radar apparatus 190 may be attained by using an FM-CW radar, with its oscillator constructed of a voltage-controlled oscillator.

The divider 187 has a fourth terminal 187*a*, a fifth terminal 187*b*, and a sixth terminal 187*c*, and by which a high-frequency signal fed to the fourth terminal 187*a* is outputted to the fifth terminal 187*b*, and a high-frequency signal fed to the fifth terminal 187*b* is outputted to the sixth terminal 187*c*. A second end 182*b* of the fourth transmission line 182 in the high-frequency signal transmission direction is connected to the fourth terminal 187*a*. The fifth terminal 187*b* is connected with a first end 183*a* of the fifth transmission line 183 in the high-frequency signal transmission direction. A second end 183*b* of the transmission line 183 in the high-frequency signal transmission direction is connected to the transceiving antenna 188.

The sixth terminal 187*c* is connected with a first end 185*a* of the seventh transmission line 185 in the high-frequency signal transmission direction. A second end 184*b* of the sixth transmission line 184 in the high-frequency signal transmission direction and a second end 185*b* of the seventh transmission line 185 in the high-frequency signal transmission direction are connected to the mixer 189. The divider 187 is attained by using a directional coupler, a branch line, a Magic T, a rat race, or the like.

A high-frequency signal produced by the high-frequency oscillator 161 passes through the third transmission line 181 and the matching circuit 1 and is fed, through the branch 186, the fourth transmission line 182, the divider 187, and the fifth transmission line 183, to the transceiving antenna 188 from which the high-frequency signal is radiated as electric waves. Moreover, a high-frequency signal produced by the high-frequency oscillator 161 passes through the third transmission line 181 and the matching circuit 1, and is then fed, through the branch 186 and the sixth transmission line 184, to the mixer 189 as a local signal.

Upon receipt of externally-coming electric waves, the transceiving antenna 188 provides high-frequency signals based on the electric waves to the fifth transmission line 183, and the high-frequency signal is fed, through the divider 187 and the seventh transmission line 185, to the mixer 189.

The mixer 189 mixes the high-frequency signals fed from the sixth and seventh transmission lines 184 and 185 to output an intermediate-frequency signal. The intermediate-frequency signal outputted from the mixer 189 is fed to the distance detector 191.

The distance detector 191 includes the above-mentioned high-frequency detector 171. On the basis of the intermediate-frequency signal obtained through the reception of electric waves (echo) which are radiated from the transceiver 180 and then reflected from an object to be detected, the distance detector 71 determines the distance to the object to be detected by calculation. The distance detector 191 is attained by using a microcomputer, for example.

In the transceiver 180, the matching circuit 1 is inserted into the third transmission line 181 so that high-frequency signals pass therethrough. This makes it possible to achieve impedance matching readily while minimizing reflection even if variations of pattern dimension occur, and thereby attain the transceiver 180 capable of providing high transmission output by virtue of the insertion loss being kept lower. Moreover, it is possible to attain the transceiver 180 which has stable wave detection characteristics, and provides high wave detection output by virtue of the insertion loss being kept lower. It is also possible to enhance the reliability of an intermediate-frequency signal produced by the mixer 189.

In the radar apparatus 190, on the basis of an intermediate-frequency signal from the transceiver 180, the distance detector detects the distance from the transceiver 180 to an object to be detected, for example, the distance between the transceiving antenna 188 and an object to be detected. Therefore, a distance to an object to be detected can be detected with high accuracy.

The branch 186 may be attained by using a hybrid circuit such as a directional coupler or a power divider. In this case, a high-frequency signal fed to the first terminal 186*a* is outputted, in a divided state, to the second terminal 186*b* and the third terminal 186*c*. In this case, the power of electric waves outputted from the transceiving antenna 188 is reduced, compared with the case of the above-mentioned construction. However, since there is no need to control the branch 186, it is possible to simplify the control of the apparatus.

In the present embodiment, the matching circuit 1 is inserted into the third transmission line 181. Alternatively, by way of another embodiment of the invention, the matching circuit 1 may be inserted into at least one of the third to seventh transmission lines 181 to 185 so that high-frequency signals pass through the matching circuit 1. Even such a structure, the same effects can be gained.

Moreover, although the transceiver 180 employs the matching circuit 1, the above-mentioned matching circuit 51 of the second embodiment may be employed. Even such a structure, the same effects can be gained.

Further, by way of still another embodiment of the invention, the divider 187 may be attained by using a circulator or a high-frequency switch element. Even such a structure, the same effects can be gained.

FIG. 15 is a schematic diagram showing the configuration of a radar apparatus 196 equipped with a transceiver 195 in accordance with a sixth embodiment of the invention. The constituent components of the radar apparatus 196 that play the same or corresponding roles as in the transmitter 160 and the receiver 170 of the preceding embodiments shown in FIGS. 12 and 13 will be identified with the same reference signs, and overlapping descriptions may be omitted. The radar apparatus 196 comprises the transceiver 195 and a distance detector 191.

The transceiver 195 comprises the above-mentioned matching circuit 1 of the first embodiment, a high-frequency oscillator 161, third to sixth transmission lines 181, 182, 183, and 184, a branch 186, a transmitting antenna 163, a receiving antenna 173, and a mixer 189. The transmitting antenna 163 and the receiving antenna 173 are attained by using a patch antenna or a horn antenna. The third to sixth transmission lines 181, 182, 183, and 184 have the same configuration as that of the transmission line 162.

A first end 181*a* of the third transmission line 181 in the high-frequency signal transmission direction is connected to the high-frequency oscillator 161, and a second end 181*b* of the third transmission line 181 in the high-frequency signal transmission direction is connected to the branch 186. The matching circuit 1 is inserted into the third transmission line 181 so that high-frequency signals pass therethrough.

The branch (switch) 186 has a first terminal 186*a*, second terminal 186*b*, and a third terminal 186*c*, and by which high-frequency signals fed to the first terminal 186*a* are selectively outputted to the second terminal 186*b* or the third terminal 186*c*. The branch 186 is attained by using a high-frequency switch element, for example. When a control signal is fed from a control section (not shown) to the branch 186, on the basis of the control signal, the connection between the first terminal 186*a* and the second terminal 186*b* or the connection between the first terminal 186*a* and the third terminal 186*c* is selectively established. The radar apparatus 196 is attained by using a pulse radar. Under the control of the control section, the first terminal 186*a* and the second terminal 186*b* are connected to each other to output a pulsed high-frequency signal from the second terminal 186*b*, and whereafter the first terminal 186*a* and the third terminal 186*c* are connected to each other to output a high-frequency signal from the third terminal 186*c*. The second terminal 186*b* is connected with a first end 182*a* of the fourth transmission line 182 in the high-frequency signal transmission direction. The third terminal 186*c* is connected with a first end 184*a* of the sixth transmission line 184 in the high-frequency signal transmission direction. The radar apparatus 196 may be attained by using an FM-CW radar, with its oscillator constructed of a voltage-controlled oscillator.

A second end 182*b* of the fourth transmission line 182 in the high-frequency signal transmission direction is connected to the transmitting antenna 163.

The receiving antenna 173 and the mixer 189 are connected to each other by the fifth transmission line 183. Moreover, a second end 184*b* of the sixth transmission line 184 in the high-frequency signal transmission direction is connected to the mixer 189.

A high-frequency signal produced by the high-frequency oscillator 161 passes through the third transmission line 181 and the matching circuit 1 and is fed, through the branch 186 and the fourth transmission line 182, to the transmitting antenna 163 from which the high-frequency signal is radiated as electric waves. Moreover, a high-frequency signal produced by the high-frequency oscillator 161 passes through the third transmission line 181 and the matching circuit 1, and is then fed, through the branch 186 and the sixth transmission line 184, to the mixer 189 as a local signal.

Upon receipt of externally-coming electric waves, the receiving antenna 173 provides high-frequency signals based on the electric waves to the mixer 189 via the fifth transmission line 183.

The mixer 189 mixes the high-frequency signals fed from the fifth and sixth transmission lines 183 and 184 to output an intermediate-frequency signal. The intermediate-frequency signal outputted from the mixer 189 is fed to the distance detector 191.

The distance detector 191 includes the above-mentioned high-frequency detector 171. On the basis of the intermediate-frequency signal obtained through the reception of electric waves (echo) which are radiated from the transceiver 195 and then reflected from an object to be detected, the distance detector 71 determines the distance to the object to be detected by calculation. The distance detector 191 is attained by using a microcomputer, for example.

In the transceiver 195, the matching circuit 1 is inserted into the third transmission line 181 so that high-frequency signals pass therethrough. This makes it possible to achieve impedance matching readily while minimizing reflection even if variations of pattern dimension occur, and thereby attain the transceiver 195 capable of providing high transmission output by virtue of the insertion loss being kept lower. Moreover, it is possible to attain the transceiver 195 which has stable wave detection characteristics, and provides high wave detection output by virtue of the insertion loss being kept lower. It is also possible to enhance the reliability of an intermediate-frequency signal produced by the mixer 189.

In the radar apparatus 196, on the basis of an intermediate-frequency signal from the transceiver 195, the distance detector detects the distance from the transceiver 195 to an object to be detected, for example, the distance between the transmitting antenna 163, as well as the receiving antenna 173, and an object to be detected. Therefore, a distance to an object to be detected can be detected with high accuracy.

The branch 186 may be attained by using a hybrid circuit such as a directional coupler or a power divider. In this case, a high-frequency signal fed to the fourth transmission line 182 is outputted, in a divided state, to the second terminal 186b and the third terminal 186c. In this case, the power of electric waves outputted from the transmitting antenna 163 is reduced, compared with the case of the above-mentioned construction. However, since there is no need to control the branch 186, it is possible to simplify the control of the apparatus.

In the present embodiment, the matching circuit 1 is inserted into the third transmission line 181. Alternatively, by way of another embodiment of the invention, the matching circuit 1 may be inserted into at least one of the third to sixth transmission lines 181 to 184 so that high-frequency signals pass through the matching circuit 1. Even such a structure, the same effects can be gained.

Moreover, although the transceiver 195 employs the matching circuit 1, the above-mentioned matching circuit 51 of the second embodiment may be employed. Even such a structure, the same effects can be gained.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

REFERENCE SIGNS LIST

- 1, 51: Matching circuit
- 2, 52: Wiring board
- 3: Bonding wire
- 4: Electronic component
- 5, 55: Transmission line
- 6, 56: Stub portion
- 7, 57: Connection portion
- 9, 59: Surface conductor layer
- 10, 60: Inner conductor layer
- 21, 65: Reflection source
- 22, 64: First transmission line
- 23, 66: Second transmission line
- 24: Dummy chip
- 25, 68: Signal line

The invention claimed is:

1. A matching circuit, comprising:
a first transmission line comprising
 a first end being connected with a load for use,
 a second end, and
 a variance area exhibiting characteristic impedance variation located between the first end and the second end;
a reflection source configured to transmit signals on the load connected to the first end, the reflection source being connected to the second end and differing in form from the first transmission line; and
second transmission line connected to the reflection source,
wherein the first transmission line and the reflection source each comprise a signal line and a ground conductor layer coupled to the signal line, and a distance between the signal line and the ground layer on a side of the first end is greater than that on a side of the second end.

2. A wiring board, comprising:
the matching circuit according to claim 1;
a dielectric layer;
the signal line disposed on a surface of the dielectric layer;
an inner Conductor layer disposed inside the dielectric layer, the inner conductor layer serving as the ground conductor layer; and
a back conductor layer disposed on a side opposite to a side on which the signal line is formed, the back conductor layer serving as the ground conductor layer,
wherein the variance area is formed with the distance varied between the signal line and the ground conductor layer, by setting a distance between the signal line and the inner conductor layer and a distance between the signal line and the back conductor layer to differ from each other, to vary the distance.

3. A transmitter, comprising:
a high-frequency oscillator configured to produce high-frequency signals;
a transmitting-signal transmission line connected to the high-frequency oscillator, and configured to transmit a high-frequency signal from the high-frequency oscillator;
the matching circuit according to claim 1, configured to be inserted into the transmitting-signal transmission line so that the high-frequency signals from the high-frequency oscillator pass therethrough; and
an antenna connected to the transmitting-signal transmission line, and configured to radiate the high-frequency signals.

4. A receiver, comprising:
an antenna configured to catch high-frequency signals;
a received-signal transmission line connected to the antenna, and configured to transmit the high-frequency signals caught by the antenna;
the matching circuit according to claim 1 configured to be inserted into the received-signal transmission line so that the high-frequency signals caught by the antenna pass therethrough; and
a high-frequency wave detector connected to the received-signal transmission line, and configured to detect the high-frequency signals transmitted to the received-signal transmission line.

5. A transceiver, comprising:
a high-frequency oscillator configured to produce high-frequency signals;
a third transmission line connected to the high-frequency oscillator, and configured to transmit the high-frequency signals;
a branch comprising a first terminal being connected to the third transmission line, a second terminal, and a third terminal, and configured to selectively output the high-frequency signals fed to the first terminal to the second terminal or the third terminal;
a fourth transmission line connected to the second terminal, and configured to transmit a high-frequency signal fed from the second terminal;
a divider comprising a fourth terminal, a fifth terminal, and a sixth terminal, and configured to output a high-frequency signal fed to the fourth terminal through the fourth transmission line to the fifth terminal, and output a high-frequency signal fed to the fifth terminal to the sixth terminal;

a fifth transmission line connected to the fifth terminal, and configured to transmit a high-frequency signal outputted from the fifth terminal and transmit a high-frequency signal to the fifth terminal;

an antenna connected to the fifth transmission line, and configured to radiate and catch high-frequency signals;

a sixth transmission line connected to the third terminal, and configured to transmit a high-frequency signal outputted from the third terminal;

a seventh transmission line connected to the sixth terminal, and configured to transmit a high-frequency signal outputted from the sixth terminal;

a mixer connected to the sixth transmission line and the seventh transmission line, and configured to mix the high-frequency signals fed from the sixth and seventh transmission lines to output an intermediate-frequency signal; and a matching circuit comprising:
 a first transmission line comprising a first end connected with a load for use, a second end, and a variance area exhibiting characteristic impedance variation located between the first end and the second end;
 a reflection source configured to transmit signals on the load connected to the first end, wherein the reflection source is connected to the second end and differs in form from the first transmission line; and
 a second transmission line connected to the reflection source,
 wherein the first transmission line and the reflection source each comprise a signal line and a ground conductor layer, wherein a distance between the signal line and the ground layer on a side of the first end is greater than that on a side of the second end,
wherein the matching circuit is configured to be inserted into at least one of the third to seventh transmission lines, so that one of a high-frequency signal from the high-frequency oscillator, a high-frequency signal from the branch, a high-frequency signal caught by the antenna, and a high-frequency signal from the divider passes therethrough.

6. A transceiver, comprising:
a high-frequency oscillator configured to produce high-frequency signals;
a third transmission line connected to the high-frequency oscillator, and configured to transmit high-frequency signals;
a branch comprising a first terminal being connected to the third transmission line, a second terminal, and a third terminal, and configured to selectively output high-frequency signals fed to the first terminal to the second terminal or the third terminal;

a fourth transmission line connected to the second terminal, and configured to transmit a high-frequency signal fed from the second terminal;
a transmitting antenna connected to the fourth transmission line, and configured to radiate high-frequency signals;
a receiving antenna configured to catch high-frequency signals;
a fifth transmission line connected to the receiving antenna, and configured to transmit the caught high-frequency signals;
a sixth transmission line connected to the third terminal, and configured to transmit a high-frequency signal outputted from the third terminal;
a mixer connected to the fifth transmission line and the sixth transmission line, and configured to mix the high-frequency signals fed from the fifth and sixth transmission lines to output an intermediate-frequency signal; and
a matching circuit comprising:
 a first transmission line comprising a first end connected with a load for use, a second end, and a variance area exhibiting characteristic impedance variation located between the first end and the second end;
 a reflection source configured to transmit signals on the load connected to the first end, wherein the reflection source is connected to the second end and differs in form from the first transmission line; and
 a second transmission line connected to the reflection source,
 wherein the first transmission line and the reflection source each comprise a signal line and a ground conductor layer, wherein a distance between the signal, line and the ground layer on a side of the first end is greater than that on a side of the second end,
wherein the matching circuit is configured to be inserted into at least one of the third to sixth transmission lines, so that one of a high-frequency signal from the high-frequency oscillator, a high-frequency signal from the branch, and a high-frequency signal caught by the receiving antenna passes therethrough.

7. A radar apparatus, comprising:
the transceiver according to claim 5; and
a distance detector configured to detect a distance from the transceiver to an object to be detected on a basis of the intermediate-frequency signal from the transceiver.

8. A radar apparatus, comprising:
the transceiver according to claim 6; and
a distance detector for detecting a distance from the transceiver to an object to be detected on a basis of the intermediate-frequency signal from the transceiver.

* * * * *